US010097273B2

(12) United States Patent
Agazzi et al.

(10) Patent No.: US 10,097,273 B2
(45) Date of Patent: Oct. 9, 2018

(54) HIGH-SPEED RECEIVER ARCHITECTURE

(71) Applicant: INPHI CORPORATION, Santa Clara, CA (US)

(72) Inventors: Oscar Ernesto Agazzi, Irvine, CA (US); Diego Ernesto Crivelli, Cordoba (AR); Hugo Santiago Carrer, Mendiolaza (AR); Mario Rafael Hueda, Cordoba (AR); German Cesar Augusto Luna, Cordoba (AR); Carl Grace, Berkeley, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/839,380

(22) Filed: Dec. 12, 2017

(65) Prior Publication Data
US 2018/0102850 A1    Apr. 12, 2018

Related U.S. Application Data

(60) Continuation of application No. 15/387,246, filed on Dec. 21, 2016, now Pat. No. 9,882,648, which is a
(Continued)

(51) Int. Cl.
*H04B 1/38*     (2015.01)
*H04L 5/16*     (2006.01)
(Continued)

(52) U.S. Cl.
CPC ........ *H04B 10/5059* (2013.01); *H03M 13/41* (2013.01); *H04B 3/235* (2013.01);
(Continued)

(58) Field of Classification Search
CPC ...... H04B 1/38; H04B 10/40; H04B 2001/38; H04B 7/0456; H04L 5/16
See application file for complete search history.

(56) References Cited

U.S. PATENT DOCUMENTS 5,239,299 A     8/1993  Apple et al.
5,265,042 A    11/1993  Smith, Jr.
(Continued)

FOREIGN PATENT DOCUMENTS

EP          1006697        6/2000
WO     WO 2001/65788      9/2001

OTHER PUBLICATIONS

United States Patent and Trademark Office, Non-Final Office Action, U.S. Appl. No. 12/056,084, dated Nov. 20, 2012, six pages.
(Continued)

*Primary Examiner* — Jean B Corrielus
(74) *Attorney, Agent, or Firm* — Richard T. Ogawa; Ogawa P.C.

(57) ABSTRACT

A receiver (e.g., for a 10 G fiber communications link) includes an interleaved ADC coupled to a multi-channel equalizer that can provide different equalization for different ADC channels within the interleaved ADC. That is, the multi-channel equalizer can compensate for channel-dependent impairments. In one approach, the multi-channel equalizer is a feedforward equalizer (FFE) coupled to a Viterbi decoder, for example, a sliding block Viterbi decoder (SBVD); and the FFE and/or the channel estimator for the Viterbi decoder are adapted using the LMS algorithm.

22 Claims, 17 Drawing Sheets

Related U.S. Application Data continuation of application No. 14/480,085, filed on Sep. 8, 2014, now Pat. No. 9,531,475, which is a division of application No. 13/013,149, filed on Jan. 25, 2011, now Pat. No. 8,831,074, which is a continuation-in-part of application No. 12/966,987, filed on Dec. 13, 2010, which is a continuation of application No. 11/559,850, filed on Nov. 14, 2006, now Pat. No. 7,852,913, which is a continuation-in-part of application No. 11/551,701, filed on Oct. 20, 2006, now Pat. No. 7,576,676, and a continuation-in-part of application No. 11/538,025, filed on Oct. 2, 2006, now Pat. No. 7,778,320.

(60) Provisional application No. 61/320,310, filed on Apr. 2, 2010, provisional application No. 61/298,125, filed on Jan. 25, 2010, provisional application No. 60/783,344, filed on Mar. 16, 2006, provisional application No. 60/779,200, filed on Mar. 3, 2006, provisional application No. 60/764,866, filed on Feb. 2, 2006, provisional application No. 60/737,103, filed on Nov. 15, 2005, provisional application No. 60/723,357, filed on Oct. 3, 2005.

(51) Int. Cl.
| | |
|---|---|
| *H04B 10/50* | (2013.01) |
| *H04B 7/005* | (2006.01) |
| *H04L 25/02* | (2006.01) |
| *H04B 3/23* | (2006.01) |
| *H03M 13/41* | (2006.01) |
| *H04B 10/2507* | (2013.01) |
| *H04B 10/294* | (2013.01) |
| *H04B 10/69* | (2013.01) |
| *H04B 1/04* | (2006.01) |
| *H04B 10/40* | (2013.01) |
| *H04B 7/0456* | (2017.01) |

(52) U.S. Cl.
CPC ....... *H04B 7/005* (2013.01); *H04B 10/25073* (2013.01); *H04B 10/2941* (2013.01); *H04B 10/6971* (2013.01); *H04L 25/0202* (2013.01); *H04L 25/025* (2013.01); *H04B 1/38* (2013.01); *H04B 7/0456* (2013.01); *H04B 10/40* (2013.01); *H04B 2001/0441* (2013.01); *H04B 2201/709772* (2013.01); *H04L 5/16* (2013.01)

(56) References Cited

U.S. PATENT DOCUMENTS

| | | | |
|---|---|---|---|
| 5,285,480 A | 2/1994 | Chennakeshu et al. | |
| 5,345,472 A | 9/1994 | Lee | |
| 5,353,307 A | 10/1994 | Lester et al. | |
| 5,533,067 A | 7/1996 | Jamal et al. | |
| 5,696,511 A | 12/1997 | Matsumoto et al. | |
| 6,229,560 B1 | 5/2001 | Jun | |
| 6,369,744 B1 | 4/2002 | Chuang | |
| 6,377,195 B1 | 4/2002 | Eklund et al. | |
| 6,384,757 B1 | 5/2002 | Kosonen | |
| 6,473,013 B1 | 10/2002 | Velazquez et al. | |
| 6,489,904 B1 | 12/2002 | Hisano | |
| 6,528,777 B2 | 3/2003 | Ames et al. | |
| 6,567,475 B1 | 5/2003 | Dent et al. | |
| 6,606,042 B2 | 8/2003 | Sonkusale et al. | |
| 6,642,871 B2 | 11/2003 | Takeyabu et al. | |
| 6,861,969 B1 | 3/2005 | Ali | |
| 6,868,129 B2 | 3/2005 | Li et al. | |
| 6,904,110 B2 | 6/2005 | Trans et al. | |
| 6,909,391 B2 | 6/2005 | Rossi | |
| 7,206,363 B2 | 4/2007 | Hegde et al. | |
| 7,206,370 B2 | 4/2007 | Nakao | |
| 7,233,270 B2 | 6/2007 | Lin | |
| 7,242,868 B2 | 7/2007 | Soto et al. | |
| 7,245,638 B2 | 7/2007 | Agazzi et al. | |
| 7,272,200 B2 | 9/2007 | Nishimura et al. | |
| 7,283,083 B1* | 10/2007 | Kamal | H03M 1/0624 341/160 |
| 7,330,140 B2 | 2/2008 | Balakrishnan et al. | |
| 7,330,507 B2 | 2/2008 | Levasseur et al. | |
| 7,336,729 B2 | 2/2008 | Agazzi | |
| 7,340,000 B1 | 3/2008 | Hart et al. | |
| 7,466,250 B2 | 12/2008 | Buisson | |
| 7,474,695 B2 | 1/2009 | Liu et al. | |
| 7,477,847 B2 | 1/2009 | Hofmeister et al. | |
| 7,564,866 B2 | 7/2009 | Agazzi et al. | |
| 7,576,676 B2 | 8/2009 | Grace | |
| 7,664,401 B2 | 2/2010 | Nelson et al. | |
| 7,724,816 B2 | 5/2010 | Chen et al. | |
| 7,778,320 B2 | 8/2010 | Agazzi et al. | |
| 7,808,417 B2 | 10/2010 | Nazemi | |
| 7,852,913 B2 | 12/2010 | Agazzi et al. | |
| 7,983,569 B2 | 7/2011 | Agazzi | |
| 8,094,056 B2 | 1/2012 | Nazemi et al. | |
| 2001/0004390 A1* | 6/2001 | Pukkila | H04L 25/0212 375/340 |
| 2001/0035997 A1 | 11/2001 | Agazzi | |
| 2001/0052869 A1* | 12/2001 | Singer | H03M 1/1245 341/156 |
| 2002/0012152 A1 | 1/2002 | Agazzi et al. | |
| 2002/0027689 A1 | 3/2002 | Bartur et al. | |
| 2002/0060827 A1 | 5/2002 | Agazzi | |
| 2002/0080898 A1 | 6/2002 | Agazzi et al. | |
| 2002/0092972 A1 | 7/2002 | Ames et al. | |
| 2002/0113726 A1 | 8/2002 | Nagaraj | |
| 2002/0181554 A1 | 12/2002 | Kim et al. | |
| 2003/0123585 A1 | 7/2003 | Yen | |
| 2003/0184466 A1 | 10/2003 | Takeyabu et al. | |
| 2003/0219083 A1 | 11/2003 | Graumann | |
| 2004/0008737 A1 | 1/2004 | McClellan | |
| 2004/0086275 A1 | 5/2004 | Lenosky et al. | |
| 2004/0090981 A1 | 5/2004 | Lin et al. | |
| 2004/0160351 A1 | 8/2004 | Rossi | |
| 2005/0018750 A1 | 1/2005 | Foerster et al. | |
| 2005/0068221 A1 | 3/2005 | Freeman et al. | |
| 2005/0084269 A1 | 4/2005 | Dallesasse et al. | |
| 2005/0088225 A1* | 4/2005 | Louis | H03G 3/3042 330/2 |
| 2005/0152479 A1 | 7/2005 | Bulow et al. | |
| 2005/0190089 A1 | 9/2005 | Draxelmayr et al. | |
| 2005/0191059 A1 | 9/2005 | Swenson et al. | |
| 2005/0219091 A1 | 10/2005 | Wood et al. | |
| 2005/0259770 A1 | 11/2005 | Chen | |
| 2006/0013296 A1 | 1/2006 | Carrer et al. | |
| 2006/0013590 A1 | 1/2006 | Hueda et al. | |
| 2006/0022738 A1 | 2/2006 | Dwelly et al. | |
| 2006/0050162 A1* | 3/2006 | Nakamura | H04N 5/335 348/308 |
| 2006/0066466 A1 | 3/2006 | Pan et al. | |
| 2006/0092804 A1 | 5/2006 | Otake et al. | |
| 2006/0147217 A1 | 7/2006 | Hahin et al. | |
| 2006/0203900 A1 | 9/2006 | Koralek | |
| 2006/0217069 A1* | 9/2006 | Chen | H04B 1/30 455/63.1 |
| 2006/0279445 A1 | 12/2006 | Kinyua et al. | |
| 2007/0092257 A1 | 4/2007 | Smith et al. | |
| 2007/0104288 A1 | 5/2007 | Kim | |
| 2007/0133662 A1 | 6/2007 | Kang et al. | |
| 2007/0133722 A1 | 6/2007 | Agazzi et al. | |
| 2007/0176814 A1* | 8/2007 | Grace | H03M 1/1042 341/155 |
| 2008/0049825 A1 | 2/2008 | Chen et al. | |
| 2008/0240325 A1 | 10/2008 | Agazzi et al. | |
| 2009/0243907 A1 | 10/2009 | Nazemi et al. | |
| 2010/0158530 A1 | 6/2010 | Soto et al. | |
| 2011/0020007 A1 | 1/2011 | Ekkizogloy et al. | |
| 2012/0252387 A1 | 10/2012 | Haskins et al. | |
| 2012/0275780 A1 | 11/2012 | Hueda et al. | |
| 2014/0036937 A1 | 2/2014 | Doerr | |

(56) References Cited

U.S. PATENT DOCUMENTS

2014/0119736 A1 5/2014 Allouche
2014/0269785 A1 9/2014 Branlund et al.
2015/0022385 A1 1/2015 D'Souza et al.

OTHER PUBLICATIONS

European Patent Office, Communication pursuant to Article 94(3) EPC, European Patent Application No. 06 849 892.2, Jul. 24, 2012, 3 pages.
European Patent Office, Communication pursuant to Article 94(3) EPC, European Application No. 06 825 423.4, Jul. 4, 2012, 4 pages.
Chang, Dong-Young, et al., "Sub 1-V Design Techniques for High-Linearity Multistage/Pipelined Analog-to-Digital Converters," IEEE Transactions on Circuits and Systems—I: Regular Papers, Jan. 2005, pp. 1-12, vol. 52, No. 1.
European Patent Office, Examination Report, Patent Application No. 06825423.4, dated Dec. 27, 2011, three pages.
European Patent Office, Examination Report, Patent Application No. 06849892.2, dated Dec. 27, 2011, three pages.
European Patent Office, Extended European Search Report and Opinion, Patent Application No. 06825423.4, dated May 11, 2011, five pages.
European Patent Office, Extended European Search Report and Opinion, Patent Application No. 06849892.2, dated May 11, 2011, five pages.
Grace, C., "Digital Calibration of Interstage Gain Errors and Signal-Dependent Variations in Pipelined Analog-to-Digital Converters," Dissertation for Degree of Doctor of Philosophy, University of California, Davis, 2004, 156 Pages.
IEEE Computer Society, "IEEE Standard for Information Technology—Telecommunications and Information Exchange Between Systems—Local and Metropolitan Area Networks—Specific Requirements, Part 3: Carrier Sense Multiple Access With Collision Detection (CSMA/CD) Access Method and Physical Layer Specifications, Amendment 2: Physical Layer and Management Parameters for 10 Gb/S Operation, Type 10 GBASE-LRM," IEEE Std. 802.3aq-2006, sixty-two pages.
Nauta, B. et al., "Analog/RF Circuit Design Techniques for Nanometerscale IC Technologies," Proceedings of ESSCIRC, 2005, pp. 45-51, Grenoble, France (XP010854902).
Ozden, M.T. et al., "Adaptive Volterra Channel Equalisation with Lattice Orthogonalisation," IEE Proc.-Commun., Apr. 1998, pp. 109-115, vol. 145, No. 2.
PCT International Search Report and Written Opinion, PCT/US06/38690, dated Nov. 5, 2007, nine pages.
PCT International Search Report and Written Opinion, PCT/US06/44679, dated Mar. 21, 2008, nine pages.
U.S. Office Action, U.S. Appl. No. 11/538,025, dated Jan. 20, 2010, nine pages.
U.S. Office Action, U.S. Appl. No. 11/538,025, May 27, 2009, dated fourteen pages
U.S. Office Action, U.S. Appl. No. 11/559,850, dated Apr. 15, 2010, seven pages.
U.S. Office Action, U.S. Appl. No. 11/559,850, dated Jan. 25, 2010, six pages.
U.S. Office Action, U.S. Appl. No. 11/559,850, dated May 27, 2009, twelve pages.
U.S. Office Action, U.S. Appl. No. 12/056,084, dated Aug. 12, 2011, fifteen pages.
U.S. Office Action, U.S. Appl. No. 12/056,084, dated Dec. 22, 2010, five pages.
U.S. Office Action, U.S. Appl. No. 12/283,788, dated Jan. 26, 2010, six pages.
U.S. Office Action, U.S. Appl. No. 12/283,853, dated Mar. 10, 2010, seven pages.
U.S. Office Action, U.S. Appl. No. 12/335,493, dated May 4, 2011, six pages.
U.S. Office Action, U.S. Appl. No. 12/839,178, dated Aug. 9, 2011, six pages.
U.S. Office Action, U.S. Appl. No. 12/839,178, dated Jan. 4, 2011, fourteen pages.
U.S. Office Action, U.S. Appl. No. 12/966,987, dated Feb. 23, 2011, seven pages.
Zanikopoulos, A. et al., "A Flexible ADC Approach for Mixed-signal SoC Platforms," IEEE, 2005, pp. 4839-4842 (XP010816680).
U.S. Office Action, U.S. Appl. No. 13/013,149, dated Oct. 15, 2013, 18 pages.
U.S. Office Action, U.S. Appl. No. 13/013,149, dated Feb. 5, 2013, 8 pages.
U.S. Office Action, U.S. Appl. No. 11/551,701, dated Aug. 22, 2008, 13 pages.
U.S. Office Action, U.S. Appl. No. 11/551,701, dated Oct. 12, 2007, 16 pages.
U.S. Office Action, U.S. Appl. No. 12/839,178, dated Mar. 20, 2012, 6 pages.
Agazzi, O. et ai, "Timing Recovery in Digital Subscriber Loops", IEEE Transactions on Communications, Jun. 1985, pp. 558-569, vol. COM-33, No. 6.
Messerschmitt, D.G., "Frequency Detectors for PLL Acquisition in Timing and Carrier Recovery," IEEE Transactions on Communications, Sep. 1979, pp. 1288-1295, vol. COM-27, No. 9.
Pfau, T. et al., "Hardware-Efficient Coherent Digital Receiver Concept with Feedforward Carrier Recovery for M-QAM Constellations," Journal of Lightwave Technology, Apr. 15, 2009, pp. 989-999, vol. 27, No. 8.
Wu, X. et al., "Iterative Carrier Recovery in Turbo Receivers with Distributed Pilots," in IEEE International Conference on Consumer Electronics, Communications and Networks (CECNet), Apr. 2011, pp. 5024-5026.
Zhang, H. et al., "Cycle Slip Mitigation in POLMUX-QPSK Modulation," in Optical Fiber Communication Conference and Exposition (OFC/NFOEC), 2011 and the National Fiber Optic Engineers Conference, Mar. 2011, pp. 1-3.
Zhang, S. et al., Pilot-Assisted Decision-Aided Maximum-Likelihood Phase Estimation in Coherent Optical Phase-Modulated Systems with Nonlinear Phase Noise, IEEE Photonics Technology Letters, Mar. 15, 2010, pp. 380-382, vol. 22, No. 6.
United States Office Action, U.S. Appl. No. 14/480,085, dated Oct. 9, 2015, 18 pages.
U.S. Appl. No. 60/840,123, filed Aug. 25, 2006.
U.S. Appl. No. 60/908,149, filed Mar. 26, 2007.

\* cited by examiner

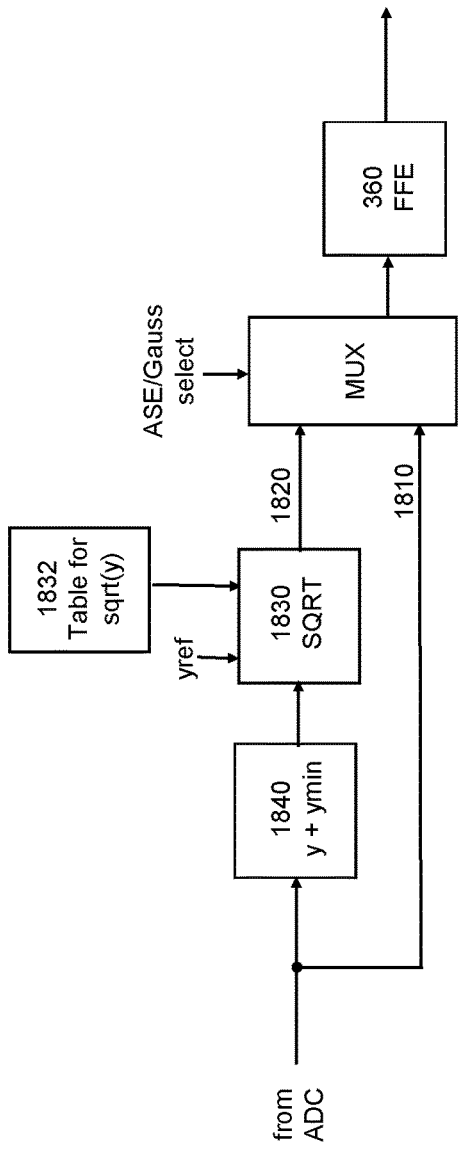
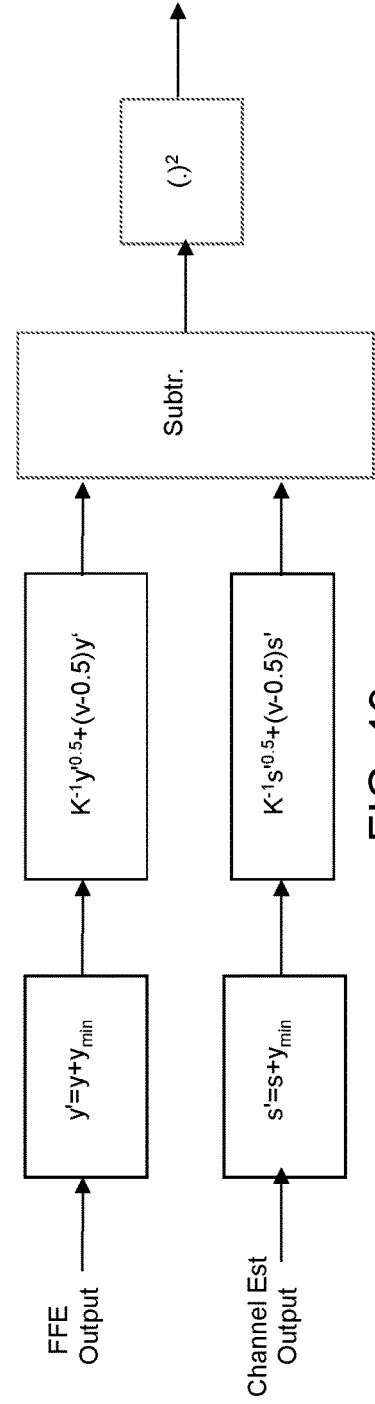

HIGH-SPEED RECEIVER ARCHITECTURE

CROSS-REFERENCE TO RELATED APPLICATION(S)

This application is a continuation of and claims priority to U.S. application Ser. No. 15/387,246 filed Dec. 21, 2016 now U.S. Pat. No. 9,882,648, issued Jan. 30, 2018, which is a continuation of and claims priority to U.S. patent application Ser. No. 14/480,085, "High-Speed Receiver Architecture," filed Sep. 8, 2014 by Oscar E. Agazzi, et al., now U.S. Pat. No. 9,531,475 issued Dec. 27, 2016, which is a divisional application of U.S. patent application Ser. No. 13/013,149, "High-Speed Receiver Architecture," filed Jan. 25, 2011 by Oscar E. Agazzi, et al., now U.S. Pat. No. 8,831,074 issued Sep. 9, 2014, which claims priority under 35 U.S.C. § 119(e) to U.S. Provisional Patent Application No. 61/298,125, "Use of the Offset Method and/or the V-Method to Compensate for Nongaussian and Signal Dependent Noise," filed Jan. 25, 2010 by Mario R. Hueda and Diego E. Crivelli; and U.S. Provisional Patent Application No. 61/320,310, "Techniques to Improve CL101X Performance in Transmissions over SMF Channels," filed Apr. 2, 2010 by Mario R. Hueda. U.S. patent application Ser. No. 13/013,149 is also a continuation-in-part of U.S. Utility patent application Ser. No. 12/966,987, "High-Speed Receiver Architecture," filed Dec. 13, 2010 by Oscar E. Agazzi et al., now abandoned, which is a continuation of U.S. Utility patent application Ser. No. 11/559,850, "High-Speed Receiver Architecture," filed Nov. 14, 2006 by Oscar E. Agazzi et al, now U.S. Pat. No. 7,852,913 issued on Dec. 14, 2010. U.S. Utility patent application Ser. No. 11/559,850 claims priority under 35 U.S.C. § 119(e) to U.S. Provisional Patent Application No. 60/737,103, "EDC Transceiver: System and Chip Architecture," filed Nov. 15, 2005 by Oscar E. Agazzi et al.; U.S. Provisional Patent Application No. 60/779,200, "MIMO/MLSE Receiver for Electronic Dispersion Compensation of Multimode Optical Fibers," filed Mar. 3, 2006 by Oscar E. Agazzi et al.; and U.S. Provisional Patent Application No. 60/783,344, "MIMO/MLSE Receiver for Electronic Dispersion Compensation of Multimode Optical Fibers," filed Mar. 16, 2006 by Oscar E. Agazzi et al. U.S. Utility patent application Ser. No. 11/559,850 is also a continuation-in-part of U.S. Utility patent application Ser. No. 11/538,025, "Multi-Channel Equalization to Compensate for Impairments Introduced by Interleaved Devices," filed Oct. 2, 2006 by Oscar E. Agazzi et al., now U.S. Pat. No. 7,778,320 issued Aug. 17, 2010, which claims priority under 35 U.S.C. § 119(e) to U.S. Provisional Patent Application Ser. No. 60/723,357, "Compensation Of Track And Hold Frequency Response Mismatches In Interleaved Arrays of Analog to Digital Converters for High-Speed Communications Receivers," filed Oct. 3, 2005 by Oscar E. Agazzi et al. U.S. Utility patent application Ser. No. 11/559,850 is also a continuation-in-part of U.S. Utility patent application Ser. No. 11/551,701, "Analog-to-Digital Converter Using Lookahead Pipelined Architecture and Open-Loop Residue Amplifiers," filed Oct. 20, 2006 by Carl Grace, now U.S. Pat. No. 7,576,676 issued on Aug. 18, 2009, which claims priority under 35 U.S.C. § 119(e) to U.S. Provisional Patent Application Ser. No. 60/764,866, "ADC Provisional Patent Application," by Carl Grace, filed Feb. 2, 2006. The subject matter of all of the foregoing is incorporated herein by reference in their entirety.

BACKGROUND OF THE INVENTION

1. Field of the Invention

This invention relates generally to high speed data communications.

2. Description of the Related Art

Optical fiber is widely used as a communications medium in high speed digital networks, including local area networks (LANs), storage area networks (SANs), and wide area networks (WANs). There has been a trend in optical networking towards ever-increasing data rates. While 100 Mbps was once considered extremely fast for enterprise networking, attention has recently shifted to 10 Gbps, 100 times faster. As used in this application, 10 Gigabit (abbreviated as 10 G or 10 Gbps or 10 Gbit/s) systems are understood to include optical fiber communication systems that have data rates or line rates (i.e., bit rates including overhead) of approximately 10 Gigabits per second. This includes, for example, LRM and SFF-8431, a specification currently under development by the SFF Committee that will document the SFP+ specifications for 10 G Ethernet and other 10 G systems.

Recent developments in 10 G optical communications have included the use of Electronic Dispersion Compensation (EDC) in receivers to extend range. For example, the IEEE 802.3aq standards committee has developed a standard (10 GBASE-LRM or simply LRM) for 10 G Ethernet over multi-mode fiber over distances of up to 220 meters using EDC. This standard is documented in IEEE Std. 802.3aq—2006 (IEEE Standard for Information technology—Telecommunications and information exchange between systems—Local and metropolitan area networks—Specific requirements, Part 3: Carrier Sense Multiple Access with Collision Detection (CSMA/CD) Access Method and Physical Layer Specifications, Amendment 2: Physical Layer and Management Parameters for 10 Gb/s Operation, Type 10 GBASE-LRM), referred to herein as IEEE 802.3aq-2006 or LRM, and incorporated by reference.

However, there are many challenges to implementing 10 G systems, especially over multi-mode fibers. Multi-mode fibers generally are a high dispersion communications channel with a significant amount of variability from fiber to fiber, and even within the same fiber over a period of time. In addition, one of the first components in a receiver is the analog to digital converter (ADC). However, a 10 G system requires a 10 G ADC, which can be difficult and expensive to build with the required resolution. More generally, various other components in the receiver may also be difficult or expensive to build at this speed of operation. In some instances, high-speed operation can be achieved by moving to more complex circuit designs or less frequently used materials (e.g., GaAs). However, added complexity often comes at the price of higher cost or lower reliability. The use of different materials systems may increase the cost by increasing the overall count of integrated circuits if the materials systems cannot be combined on a single integrated circuit.

SUMMARY OF THE INVENTION

The present invention overcomes the limitations of the prior art by providing a receiver and/or transceiver with various features or combinations of features. In one aspect, the receiver includes an interleaved ADC coupled to a multi-channel equalizer that can provide different equalization for different ADC channels within the interleaved ADC. That is, the multi-channel equalizer can compensate for channel-dependent impairments. In one approach, the multi-channel equalizer is a feedforward equalizer (FFE) coupled to a Viterbi decoder, for example a sliding block Viterbi decoder (SBVD). In one approach, the FFE and/or the channel estimator for the Viterbi decoder are adapted using the LMS algorithm.

In various aspects, the interleaved ADC can include different combinations of features. For example, the interleaved ADC can be based on a lookahead pipelined architecture. It may additionally use open-loop residue amplifiers in the pipeline, rather than closed-loop amplifiers. The non-linearity of the open-loop amplifiers can be corrected by calibration, in one approach based on lookup tables. In one design, the ADC pipeline units perform an N-bit digital conversion but the ADC pipeline units themselves generate M raw bits, with M>N (i.e., a sub-radix architecture), thus adding redundancy to compensate for the lower accuracy open-loop amplifiers. If lookup table calibration is used, the M raw bits can be used as an address to the lookup table. The contents at any M-bit address are the corresponding N-bit digital representation. Optionally, a calibration unit can update the lookup table, possibly automatically during operation. In one approach, there are two pipeline units for each ADC channel of data, with one unit performing A/D conversion while the other unit is being calibrated.

In another aspect, the multi-channel equalizer can also include different combinations of features. In one implementation, the multi-channel equalizer is implemented based on N-tap, M-parallel finite impulse response (FIR) filters. Two architectures for the FIR are multiply-accumulate and lookup table-accumulate (where the multiplication is implemented by lookup table). For FIR filters with larger numbers of taps, a multi-stage architecture can be used. For example, a 25-tap FIR filter can be implemented as 5 groups of 5-tap filters.

Different levels of "multi-channelness" are also possible. At one extreme, each equalizer coefficient in the multi-channel equalizer is dedicated exclusively to one and only one of the interleaved channels. In this approach, each of the channels can be adjusted entirely independently of the others. At the other extreme of no "multi-channelness," the same coefficients are applied to all interleaved channels. In hybrid approaches, at least some of the equalizer coefficients are shared by at least some (and possibly all) of the interleaved channels. Alternately, the equalization can include both a term based on shared coefficients and another term based on channel-dependent coefficients.

In some implementations, the interleaved channels from the ADC are not recombined into a single high-speed channel before equalization. Rather, the parallelism is maintained and the multi-channel equalization applied in that format. In fact, the incoming data may be demultiplexed even further if, for example, the equalizer circuitry runs at a slower speed than the ADC circuitry.

One aspect of the equalizer is its adaptation. In one design, the multi-channel equalizer includes an FFE coupled to a SBVD and LMS adaptation is used for both the FFE and the channel estimator for the SBVD. However, the adaptation can be implemented on a sub-sampled basis. If the parallel format of the interleaved ADC is preserved, then each ADC channel is inherently sub-sampled since one ADC channel alone does not contain all samples. Sub-sampled adaptation would be advantageous since it can avoid the complicated circuitry required by adaptations based on all samples.

In another aspect, a timing recovery circuit is used to drive the clock for the interleaved ADC. In one implementation, the timing recovery circuit includes a "pulse preprocessor," which is used to adapt to time-varying impulse responses of the channel, as is common for multi-mode fibers. In addition, the timing recovery circuit can be driven by the output of the interleaved ADC, rather than the output of the multi-channel equalizer, as this reduces the latency in the timing recovery feedback loop, thus enabling a higher loop bandwidth.

In another aspect, automatic gain control is applied to the incoming signal. A multi-stage gain control can be used, including coarse and fine gain control, for example.

In one specific implementation, a transceiver chip is designed for 10 G applications. Using the XAUI interface as an example, the on-chip transmit path includes the XAUI interface, an encoder/decoder, MUX and pre-driver. The laser driver and laser are provided off-chip.

In the receive path, the photodiode and transimpedance amplifier are provided off-chip. The chip includes a programmable gain amplifier that applies a variable gain to the incoming signal from the transimpedance amplifier. The gain is controlled by the two-stage coarse and fine automatic gain control. The output of the programmable gain amplifier enters the interleaved ADC, which in this example includes eight ADC channels of nominally 1.25 GS/s each. Each channel includes two ADC pipeline units (based on lookahead pipeline with sub-radix architecture), which automatically switch between active operation and calibration. The digital data from the eight ADC channels then enter the multi-channel equalizer. They are also used to drive the automatic gain control and the timing recovery circuitry.

In this example, the multi-channel equalizer is actually 16-parallel. Each of the eight ADC channels is further demultiplexed by a factor of two so that the equalizer can run at a slower speed. The multi-channel equalizer includes an FFE coupled to a SBVD, both of which are adapted using LMS as described above. Much of the basic filter architectures are based on lookup tables. The output of the multi-channel equalizer is input to the XAUI interface. The single chip implementation includes all of the functional blocks described above, from XAUI interface to pre-driver on the transmit path and from programmable gain amplifier to XAUI interface on the receive path. This particular implementation is given as an example. The invention is not limited to this implementation, nor is every other design required to have every feature described in this implementation.

Yet another aspect is a startup procedure for the receiver. In one approach, the coarse gain control is set, followed by the fine gain control. The timing recovery circuitry can then acquire phase lock with the incoming signal. The ADC pipeline units typically will also auto-calibrate before or during this process. The multi-channel equalizer is then converged. This can be a two-step process, with the first step being the selection of cursor delays that minimize the error signal and the second step being the convergence of the equalizer given the selected cursor delays.

Other aspects of the invention include various combinations of the features described above, devices that use these combinations, systems based on these devices and methods related to any of the foregoing.

BRIEF DESCRIPTION OF THE DRAWINGS

The invention has other advantages and features which will be more readily apparent from the following detailed description of the invention and the appended claims, when taken in conjunction with the accompanying drawings, in which:

FIG. 18 is a block diagram of an adaptation of an MLSE, according to one embodiment.

FIG. 19 is a block diagram illustrating calculation of metric M.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENTS

Figure 1:
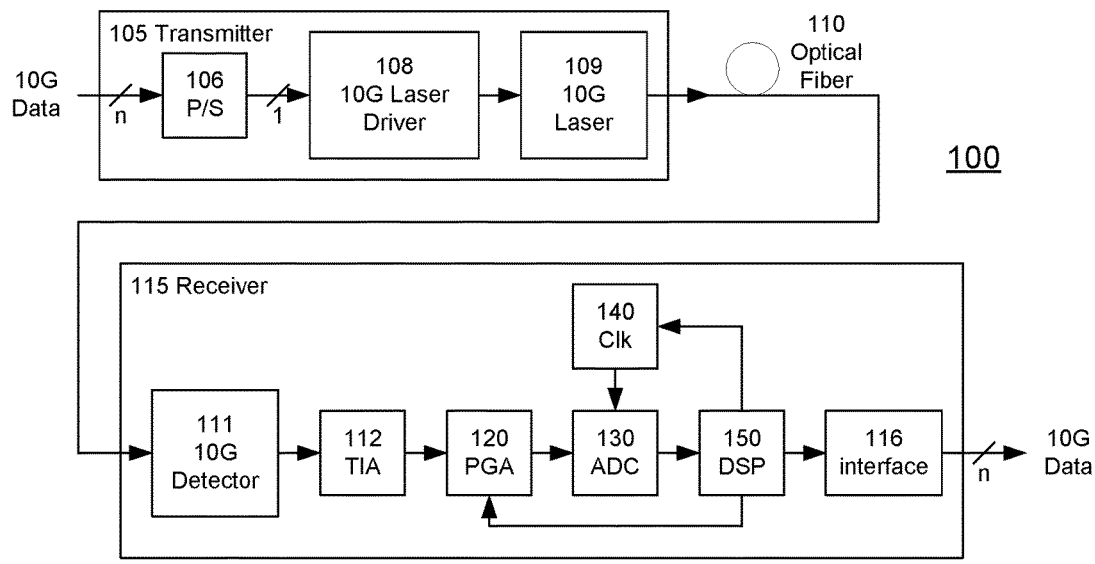
FIG. 1 is a block diagram of a system including the present invention.

FIG. 1 shows an optical fiber communications link 100 according to the invention. The link 100 includes a transmitter 105 coupled through optical fiber 110 (the communications channel) to a receiver 115. A typical transmitter 105 may include a serializer or parallel/serial converter (P/S) 106 for receiving data from a data source on a plurality of parallel lines and providing serial data to a laser driver 108. The driver 108 then drives a laser source 109, for example a 1310 nm Fabry-Perot or DFB laser. The laser source 109 launches the optical waveform carrying the digital data on optical fiber 110.

On the receive side, a typical receiver 115 includes a photodetector 111 for receiving and detecting data from the optical fiber 110. The detected data is typically processed through a transimpedance amplifier (TIA) 112. A programmable gain amplifier (PGA) 120 applies a variable gain to the electrical analog signal. The resulting electrical signal is converted to digital form by an interleaved ADC 130. The interleaved ADC 130 is timed by a clock signal produced by the sampling clock generator 140. The digital output of the ADC 130 is further processed by digital signal processing circuitry (DSP) 150 to recover the digital data. In this example, the DSP implements electronic dispersion compensation using a multi-channel equalizer. The recovered data may then be placed on the appropriate interface by interface circuitry 116. For example, if receiver 115 is implemented on a chip that is mounted on a host, the interface 116 may be an interface to the host. In FIG. 1, the interface is shown as a 10 G data stream with n parallel lines. The DSP 150 also produces signals for the sampling clock generator 140 and the PGA 120.

The following example will be illustrated using a 10 G receiver. While 10 G systems serve as convenient examples for the current invention, the current invention is not limited to 10 G systems. Examples of other systems to which the current invention could be applied include Fibre Channel systems, which currently operate at speeds from 1 Gbps to 10 Gbps, as specified by the Technical Committee T11, a committee of the InterNational Committee for Information Technology Standards (INCITS).

One place where the following examples deviate from the LRM standard is the fiber length. The draft standard specifies 220 meters, but the following examples use a 300 meter length. This is motivated by the large number of fibers in the field whose length approaches 300 meters, and by the fact that users of EDC technology have expressed a desire for this extended reach. Although the LRM channel is used in the following examples in order to make them more concrete, the techniques illustrated are general and they can be used in many other fiber optic or other communications applications. Other fiber optic applications for which these techniques can be used include, for example, systems using single mode optical fiber as the communications medium.

Figure 2:
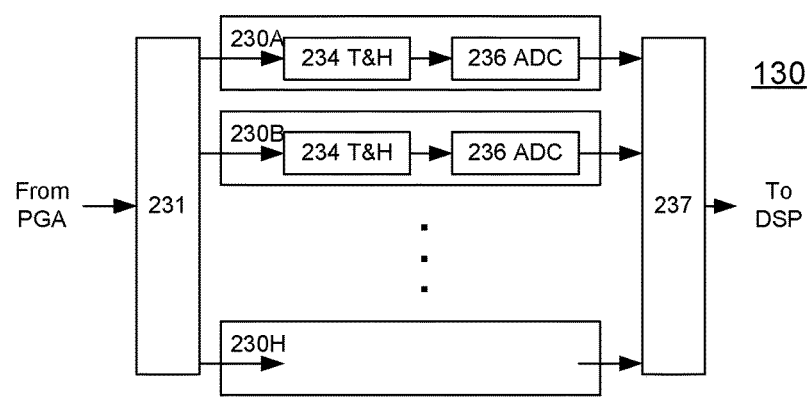
FIG. 2 is a block diagram of one embodiment of the interleaved ADC of FIG. 1.
Figure 3:
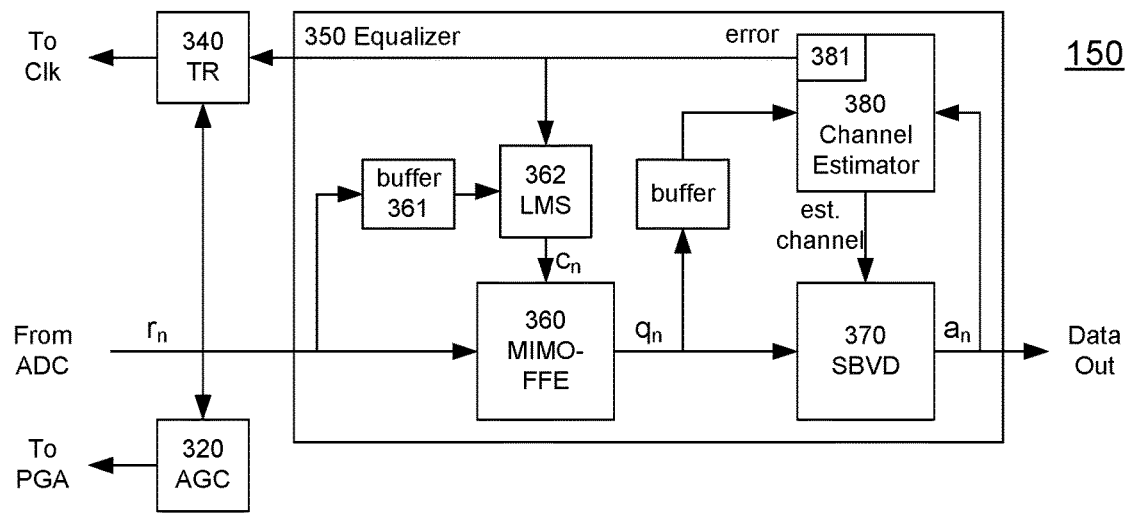
FIG. 3 is a block diagram of one embodiment of the DSP of FIG. 1.

FIGS. 2 and 3 provide more detailed block diagrams of receiver 115. The figures after that provide even more detail on the operation of specific components shown in FIGS. 2 and 3.

FIG. 2 is a block diagram of one embodiment of the interleaved ADC 130. The interleaved ADC contains M parallel ADC channels 230A-230M. Each ADC channel 230 typically includes a track-and-hold (T&H) unit 234 followed by the actual ADC conversion circuitry 236. The ADC channels 230A-H are time interleaved by an analog demultiplexer 231 and digital retimer 237. In this example, the analog demultiplexer 231 demultiplexes the incoming 10 G analog signal into eight parallel time-interleaved ADC channels 230. Each ADC channel 230 operates at a nominal conversion rate of 1.25 GS/s (actual conversion rate 1.29 GS/s). In addition, a multi-channel equalizer 350 in the DSP (see FIG. 3) corrects channel-dependent impairments from the interleaved ADC, as well as other impairments such as dispersion introduced by the optical fiber 110.

In some embodiments, the retimer 237 may also multiplex the eight ADC channels 230 back into one or more higher data rate signals (e.g., into one 10 G signal, or two parallel 5 G signals, etc.). In the particular implementation shown in FIG. 2, the DSP 150 uses a parallelization factor of 16, as will be described below, so the retimer 237 not only retimes the ADC channels 230 but also demultiplexes each ADC channel 230 by a factor of two.

FIG. 3 is a block diagram of one embodiment of the DSP 150. The DSP 150 can roughly be divided into three sections: automatic gain control (AGC) circuitry 320, timing recovery circuitry 340 and the rest of the DSP 150, which implements a multi-channel equalizer 350. The AGC circuitry 320 receives the ADC output and generates a control signal for the PGA 120. The timing recovery circuitry 340 provides signals to the clock generator 140 in order to produce a clock for the ADC 130 that is aligned with the incoming analog signals. Note that the timing recovery circuitry 340 takes the ADC output as its input (rather than the multi-channel equalizer 350 output as its input). This reduces the latency in the timing recovery feedback loop, thus enabling a higher loop bandwidth without making the feedback loop unstable.

The multi-channel equalizer 350 in this example is a maximum likelihood sequence estimation (MLSE) equalizer. This is motivated by the fact that the optimal receiver for an intersymbol interference channel in the presence of Gaussian noise consists of a whitened matched filter followed by a maximum likelihood sequence detector. The equalizer 350 includes a MIMO-FFE (C) 360 coupled to a sliding block Viterbi decoder (SBVD) 370 and a MIMO channel estimator (B) 380. This architecture is able to compensate for the ISI of MMF, as well as for the impairments of the receiver front-end, such as channel-to-channel variations in the interleaved ADC 130.

In more detail, the MIMO-FFE 360 applies feed-forward equalization to the digital data received from the ADC 130. The coefficients for the equalization are updated using the LMS algorithm, as implemented by circuitry 362. The SBVD 370 then makes decisions based on the equalized samples from the FFE 360. These are output as the digital data recovered by the receiver (or possibly converted from serial to parallel form). Circuitry 380 is the channel estimator for the SBVD 370. The estimated channel is used by the SBVD 370 to make its decisions. An error computation unit 381 calculates the error between the FFE 360 output $q_n$ and the output of the channel estimator 380. The error signal produced by the channel estimator 380 is used by the LMS update circuitry 362 to update the coefficients for the FFE 360 and is also used by the timing recovery circuitry 340 to adjust the clock 140 driving the ADC 130. The channel estimator 380 itself is also adaptive, in this example also based on the LMS algorithm.

Figure 4:
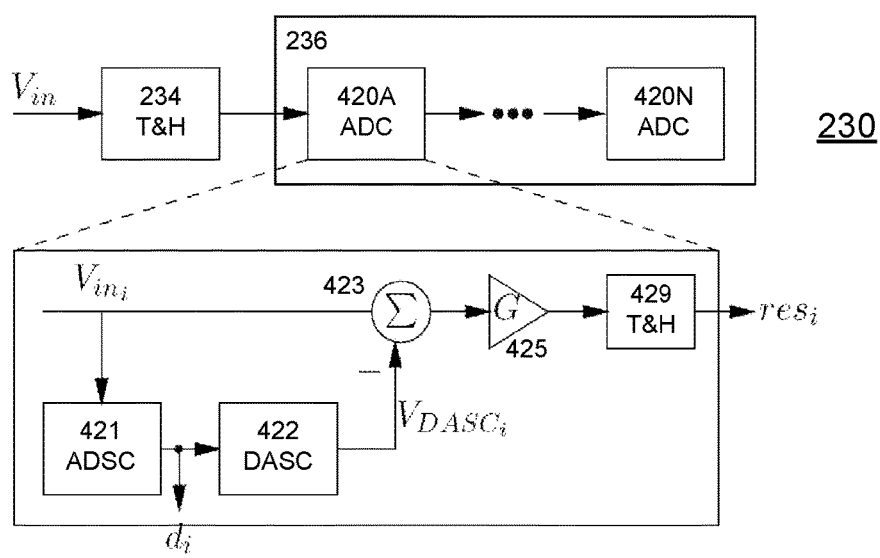
FIG. 4 is a block diagram of a pipelined ADC architecture suitable for use as an ADC channel.
Figure 5:
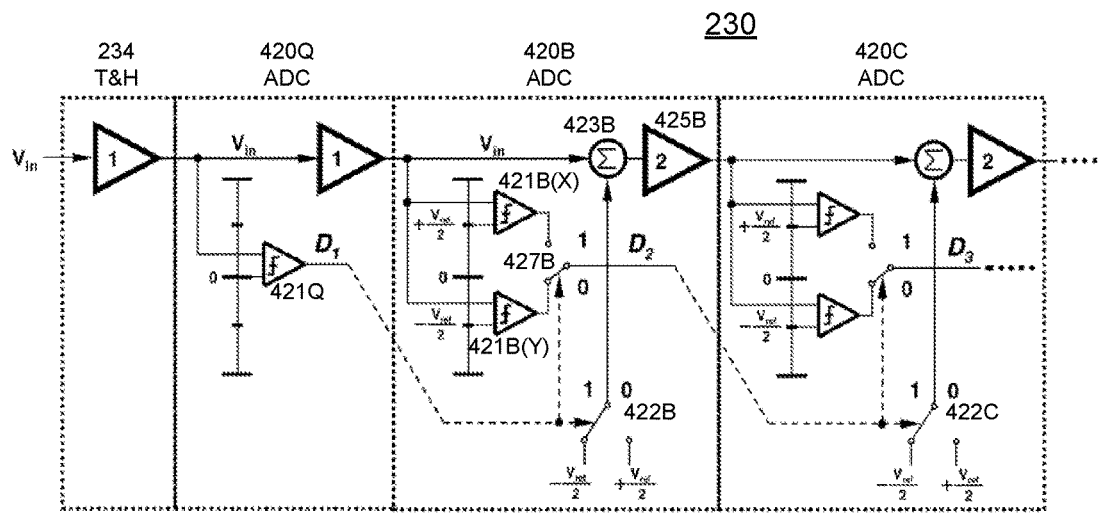
FIG. 5 is a block diagram of an ADC pipeline with lookahead capability.
Figure 6:
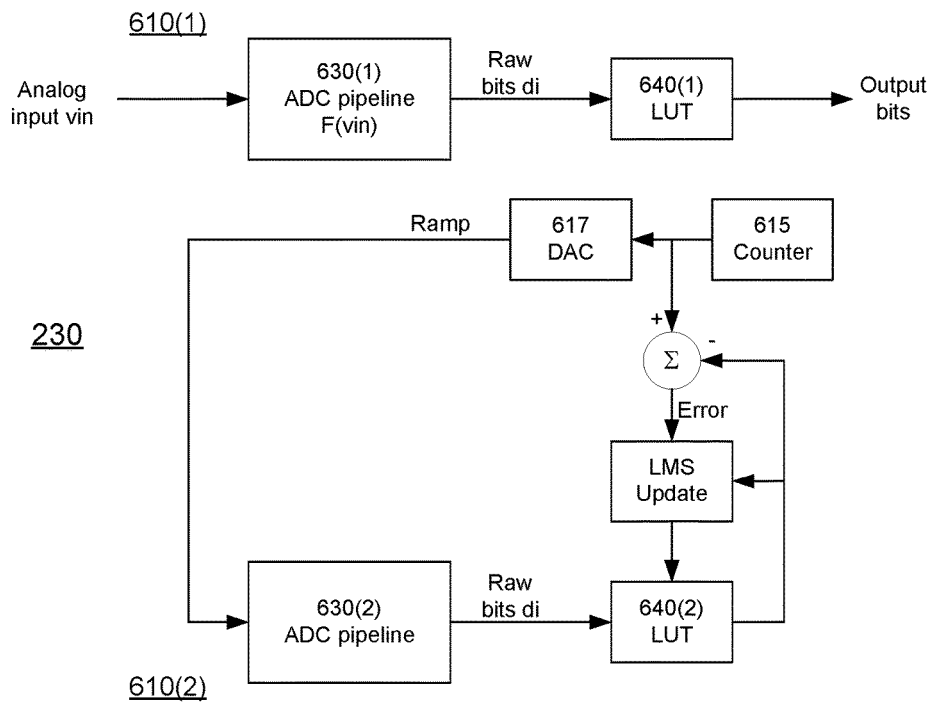
FIG. 6 is a block diagram of a lookup table approach to compensating for ADC non-linearity in an ADC pipeline.

FIGS. 4-6 provide further details on one implementation of the ADC 130 of FIG. 2. FIG. 4 is a block diagram illustrating a pipelined ADC architecture suitable for use as an ADC channel 230. The ADC pipeline 230 includes an input track-and-hold stage 234 followed by a number of low resolution ADC stages 420A-420N. The stages 420 preferably are identical, except that the beginning and ending stages may be different due to their location at the beginning or end of the pipeline 230. In this example, each ADC stage 420 is a 1-bit stage. Each stage 420 includes a 1-bit analog-to-digital converter (e.g., a comparator) 421, a 1-bit digital-to-analog converter 422 (e.g., a switch), an analog subtractor 423, a gain stage (i.e., the residue amplifier) 425, and a track-and-hold circuit 429. The 1-bit ADC 422, which will also be referred to as a sub-ADC, makes a 1-bit decision on the input signal $V_{ini}$ for the stage 420. This bit $d_i$ is used in the sub-DAC 422 to generate a voltage $V_{DASCi}$ representing the contribution of that bit $d_i$ to the input signal $V_{ini}$. The subtractor 423 subtracts the contribution $V_{DASCi}$ from the input signal $V_{ini}$ to develop a residue, which is the remaining value of the input signal after the value of the previously decided bits is removed. The residue amplifier 425 multiplies the residue by a gain value G (which is 2 if the stage converts one effective bit). The resulting residue $res_i$ is held in a track-and-hold circuit 429 and used as the input signal $V_{ini}$ for the next stage. Thus, each stage is operating to produce 1 bit of the result. The gain of 2 applied by the residue amplifier 425 scales the residue so that the same circuitry can be used for the next stage. The speed of this converter is limited by the critical path consisting of the 1-bit ADC (typically a comparator) 421, the 1-bit DAC (which is typically just a switch) 422, the subtractor 423, and the residue amplifier 425.

In one implementation, unlike conventional ADC pipelines, the residue amplifiers 425 are implemented as open-loop amplifiers rather than closed-loop amplifiers. Closed-loop amplifiers can be more closely controlled, in terms of parameters such as gain and nonlinearity. However, closed-loop amplifiers have more severe speed limitations or require more power to achieve a given speed than open-loop amplifiers. The use of open-loop amplifiers provides higher speed (increases swing and bandwidth) with lower power. It can also reduce requirements on transistor performance.

However, because the gain G provided by open-loop amplifiers 425 can be less controlled, some form of redundancy is preferably employed to avoid the loss of analog information in the pipeline. In one approach, a sub-radix architecture with redundancy is used. In a non-redundant architecture, the total number of raw bits $d_i$ generated by the stages 420 is the same as the number of bits in the digital representation. In a redundant architecture, the stages 420 produce more raw bits $d_i$ than the number of output bits in the digital representation. The extra bits represent redundant information which is used to correct errors in the pipeline. In a sub-radix architecture, each stage 420 outputs one raw bit $d_i$ but effectively converts less than one output bit of the digital representation. Therefore, the total number of stages 420 is more than the number of output bits in the digital value.

For example, in one non-redundant architecture, each stage 420 effectively converts 1 bit and the residue amplifier gain G is 2. Therefore, eight stages 420 are required to implement an 8-bit A/D conversion. The eight raw bits $d_i$ are the actual output bits in the digital representation of the analog value, with the raw bit from stage 1 being the most significant output bit. As an example of a sub-radix architecture, each stage 420 might generate 1 raw bit but convert only 0.8 output bits with a residue amplifier gain G of $2^{0.8}$. More stages 420 are required, 10 stages in this case to implement an 8-bit A/D conversion. The 10 raw bits $d_i$ from the stages 420 are not the 8 output bits in the digital representation but are used to generate the final 8 bits using known algorithms. The sub-radix architecture allows gains errors to be tolerated by an amount proportional to the amount of gain reduction. It also allows redundancy with not much additional hardware.

A popular redundancy technique is a 1.5 output bits/stage architecture. In this technique, each stage 420 outputs 2 raw bits (thereby requiring additional comparators, which dissipate additional power), and backend processing uses this redundant information to improve accuracy. Using this technique, the accuracy of the ADC pipeline is set primarily by the accuracy of the interstage gain G. Because the gain of open-loop interstage amplifiers 425 is not as well controlled, this technique is not preferred for the present application. A sub-radix architecture, on the other hand, maintains 1 output bit per stage but provides redundancy by interstage gains of less than 2, and the accuracy of the interstage gain G is not as central to the architecture. This requires additional stages 420 (for example, an 8-bit ADC pipeline might require 10 or 11 stages using this technique) but only 1 comparator per stage. Again, backend processing uses the redundant information to provide the required accuracy.

FIG. 5 is a block diagram of an ADC pipeline with lookahead capability. In a conventional ADC pipeline, the high speed comparator 421 regenerates between clock phases. This allows the comparator output time for positive feedback to drive the output to the desired value. Because of the relatively slower closed-loop interstage amplifiers, the clock period is set long enough that the comparator 421 has plenty of time to regenerate. However, with faster open-loop interstage amplifiers 425 and the resulting shorter clock periods, the comparator 421 may not have enough time to completely regenerate. One solution is to use a lookahead pipeline.

In the lookahead pipeline, the critical timing path, consisting of the amplifier settling time plus the comparator regeneration time, is broken into two shorter paths. In the example shown, all stages 420 (other than the first stage 420Q) have a pair of comparators 421(X) and 421(Y) (rather than a single comparator) that operates to develop the possible values for the stage based on the input value to the previous stage. This basically allows the interstage amplification and the comparator operation to occur in parallel, giving the comparators an entire clock half-period to regenerate. In this architecture, the first stage 420Q (that generates raw bit $D_1$) is a "half-stage" that uses a single comparator. The remaining stages 420B-N use two comparators 421 per stage. The last stage may be simplified since there is no following stage. The last stage could contain only the circuitry required to generate the last raw bit $D_N$ (e.g., eliminating the subtractor 423N and open-loop amplifier 425N). The architecture is somewhat more complex that an ADC pipeline without lookahead, but it allows much higher speeds when the interstage amplifier's speed is comparable to the comparator's speed.

In some sense, the sub-ADC 421 operation for a lookahead stage is moved ahead one stage. Referring to FIG. 5, stage 420B determines bit $D_2$. However, the input value to stage 420B is the original $V_{in}$. It is not the residue of $V_{in}$ after the contribution due to bit $D_1$ has been removed, as would be the case in an ADC pipeline without lookahead. In fact, the output of stage 420B (rather than the input) is the residue after the $D_1$ contribution has been removed. This one-stage shift is what allows the interstage amplification and the comparator operation to occur in parallel.

However, the sub-ADC 421 for stages 420B-N becomes more complex. The sub-ADC 421B for the second lookahead stage 420B includes two comparators 421B(X) and 421B(Y). These comparators determine the bit $D_2$ for stage 420B. Comparator 421B(X) determines bit $D_2$ assuming that bit $D_1$ is a 1. Comparator 421B(Y) determines bit $D_2$ assuming that bit $D_1$ is a 0. Switch 427B determines which result to select, depending on the output of sub-ADC 421Q of the previous stage 420Q. The bit $D_2$ is fed to the sub-DAC 422C of stage 420C.

As described above, the lookahead pipeline architecture allows a full clock half period for the comparators to regenerate. There is also the potential to use part of the amplifier settling time for comparator regeneration, since the amplifier output will be approaching its final value closely enough that the comparator threshold has been passed and the comparator can begin regenerating.

FIG. 6 is a block diagram illustrating a lookup table approach to compensating for amplifier non-linearity. A pipelined ADC typically requires fairly linear residue amplifiers 425 if the result is to be used without additional correction. One drawback of using open-loop amplifiers 425 is they can be non-linear. Different approaches can be used to compensate for effects caused by the non-linearity of open-loop amplifiers 425. FIG. 6 illustrates one approach using a lookup table.

Each interleaved ADC channel 230 includes two pipeline units 610(1) and 610(2). Each ADC pipeline unit 610 includes an ADC pipeline 630 followed by a calibration unit, which in this example is a lookup table 640. As a result of the non-linearities of the individual stages 420 in the pipeline 630, the response of the overall ADC pipeline 630 has a complex non-linear characteristic, denoted in FIG. 6 by a function f(vin). In other words, the raw bits $d_i$ generated by the pipeline stages do not map in a linear manner to the output bits in the final digital representation. In FIG. 6, the "distorted" raw bits $d_i$ from the ADC pipeline 630 are applied to a lookup table 640 which stores the inverse of the non-linear characteristic. Thus, the LUT 640 reverses the effects of the non-linear open-loop amplifiers, and the output of the LUT 640 is used as the digital output of the ADC.

Each ADC channel 230 includes two pipeline units 610(1) and 610(2) which are constantly being swapped between normal operation and calibration modes, at a rate of about 1 MHz. At any given instant, one of the two pipelined units is in normal operation, while the other is in calibration. Approximately every microsecond, the units are automatically interchanged. Therefore, to an external observer, the pair of pipelined units 610(1) and 610(2) operates as a single high-precision ADC channel 230.

For the pipelined unit 610(1) that is in normal operation, the calibration portion of a pipelined unit 610(1) behaves as a simple lookup table 640(1). The raw output from the ADC pipeline 610(1) is the memory address used to access the lookup table 640(1). The content at this memory address is the digital output of the ADC channel 230.

For the pipelined unit 610(2) that is in calibration, the lookup table 640(2) contents are updated. The update is based on a reference ramp generated by a digital counter 615 followed by a high precision DAC 617, which provides the input for the ADC pipeline 610(2) under calibration. Since the ramp can be relatively slow, a digital ramp can be generated from the DSP 150. The lookup table 640(2) is updated using an LMS algorithm, where the error is computed as the difference between the current content of the lookup table entry addressed by the pipeline output and the expected output, which is the output of the counter 615. If the two quantities are identical, the lookup table 640(2) entry is already correct and it does not need to be updated. Correspondingly, the error is zero, so that no update takes place. However, if the two quantities differ, there will be an update. The LMS algorithm effectively averages many updates, so that the entries in the lookup table 640(2) are not computed based on a single conversion, but on an average of many conversions.

Now consider the design of an interleaved ADC for the following 10 G example:
  10 GS/s nominal conversion rate (10.3125 GS/s actual conversion rate)
  8 bit accuracy In one design, the ADC includes eight parallel time-interleaved ADC channels 230A-H. Each ADC channel 230 operates at a nominal conversion rate of 1.25 GS/s (actual conversion rate 1.29 GS/s). Each ADC channel 230 includes two ADC lookahead pipelines 630 of 11 stages each, with one pipeline in service at any one time and the other available for calibration. Each of the 16 lookahead pipelines 630 uses open-loop interstage amplifiers and subranging lookahead pipeline architecture. Lookup table calibration compensates for non-linearities. There are 16 lookup tables for the non-linear calibration, one for each of the 16 pipelines. Each lookup table takes the 11-bit raw input from the lookahead pipeline as input and outputs the corrected 8-bit digital value.

Allowing for the expected worst case offset values and interstage gain tolerance (for the open-loop amplifiers), computing the required redundancy gives an ADC pipeline with 11 stages and an interstage nominal gain G of 1.75. The 3 sigma input referred offset including comparators and residue amplifiers is estimated at 26 mV. This results in an interstage gain G of less than 1.82. With gain G=1.75, 11 stages are required to achieve 8 bit performance with 10% tolerance on the gain G.

The digital output of the interleaved ADC 130 is further processed by the multi-channel equalizer 350. FIGS. 7-12 provide further details on one example of a suitable multi-channel equalizer 350.

Figure 7A:
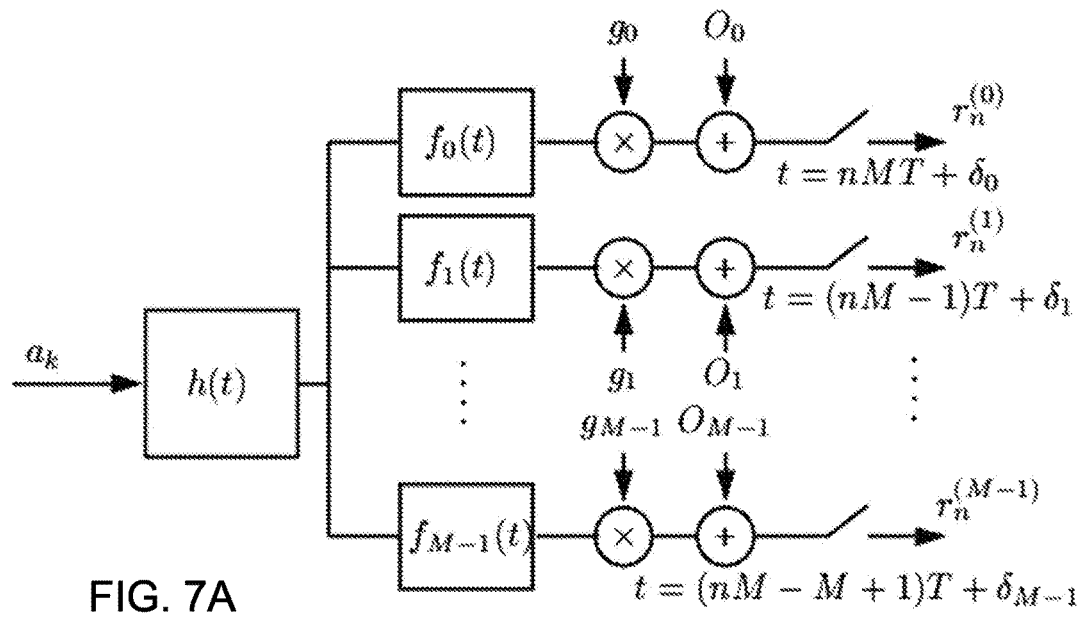
FIGS. 7A-7C are block diagrams modeling the interleaved ADC as part of the communications channel.

FIG. 7A shows a model of the communications link where the impairments of the analog front end, particularly the M-parallel time interleaved ADC system 130, are explicitly shown as part of the communications channel. Here, h(t) models the optical channel 110 response as well as the receive filter and any other linear element present in the link and $a_k \in \{-1, +1\}$ are the transmitted symbols. Blocks $f_0(t)$ to $f_{M-1}(t)$ model the frequency responses of each track-and-hold (T&H) unit 234 in the interleaved ADC 130. This response can vary from one ADC channel 230 to the next. Gain errors and offsets in the ADC channels 230 are modeled by $g_0$ to $g_{M-1}$ and $O_0$ to $O_{M-1}$, respectively. Finally, $\delta_0$ to $\delta_{M-1}$ model sampling time errors. The output of the system is comprised by M parallel samples, $r_n^{(0)}$ to $r_n^{(M-1)}$, which will be processed by the multi-channel equalizer 350. Note that the superscript identifies baud spaced samples, whereas subscript n represents samples spaced M-baud periods apart. For simplicity, noise sources such as additive white Gaussian noise (AWGN) and quantization noise are not explicitly shown in the diagram.

Figure 7B:
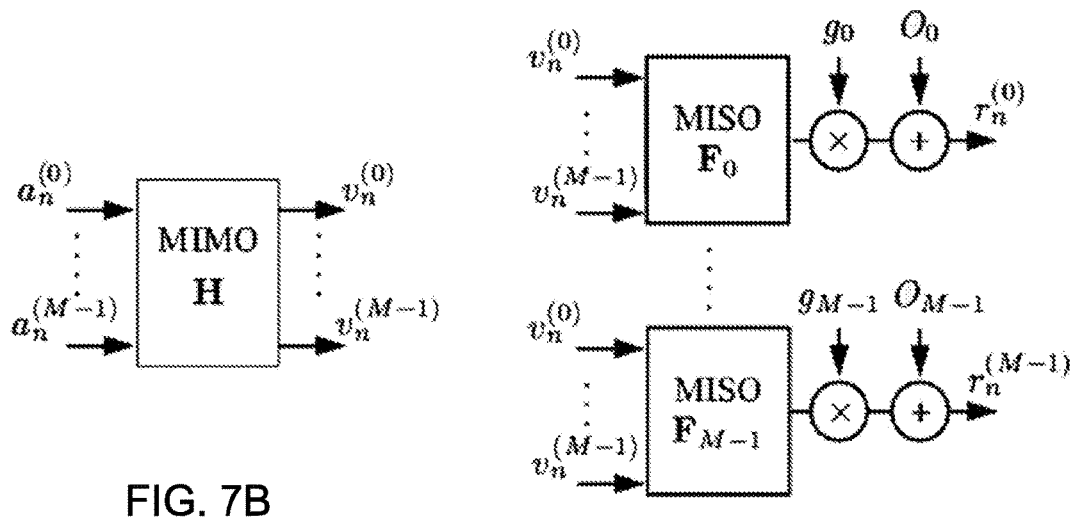

First transform filters h(t) and $f_0(t)$ through $f_{M-1}(t)$ from the continuous to the sampled time domain. The transformation assumes ideal sampling (sampling without phase errors). Sampling time errors will be modeled with a multiple-input, multiple-output (MIMO) interpolation filter, as will be seen later. Defining:

$$a_n^{(i)} = a_{(nM-i)} \quad i=0, \ldots, M-1, \tag{1}$$

a MIMO description of this communications link is obtained by converting the single-input, single-output (SISO) filters h(t) and $f_0(t)$ through $f_{M-1}(t)$ to a MIMO and a multiple-input, single-output (MISO) representation, respectively, as shown in FIG. 7B. The MIMO and MISO models can be combined to obtain a single MIMO representation.

Figure 7C:
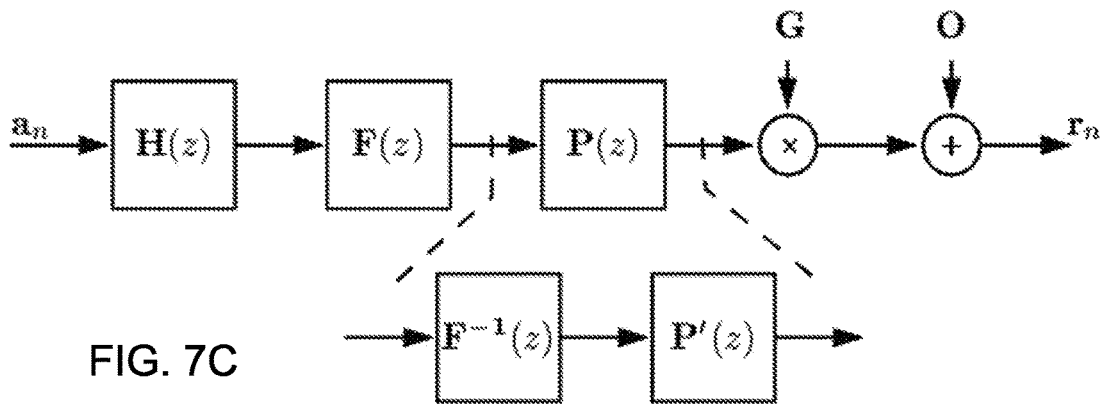

In this way, the MIMO model accepts M-dimensional input vectors whose components are transmitted symbols, and produces M-dimensional output vectors whose components are signal samples, at a rate 1/MT. FIG. 7C shows a diagram of the MIMO model. The vector of input symbols $a_n$ feeds the communications channel response matrix H(z). The output of this channel is fed to the T&H matrix filter F(z), which models the independent T&H responses. P(z) models the sampling time errors. It can be seen as a block that interpolates the samples taken without sampling errors at the output of the channel and generates M outputs with sampling errors. With identical T&H responses, the sampling time errors can be modeled using an interpolation filter that generates samples with phase errors for each output of the MIMO model. When T&H responses are taken into account, a possible way to continue to use the interpolator filter is to invert the response of F(z), as is shown inside the dotted line of FIG. 7C. While the use of an interpolation filter is completely accurate only when samples are free of aliasing, it can still be used as an approximation when there is some aliasing owing to T-spaced sampling and excess bandwidth greater than zero. This approximation is valid when sampling time errors are small. Finally, matrix G and vector O represent gain and offsets errors, respectively. From FIG. 7C, the MIMO model can be written as:

$$r(z) = GP(z)F(z)H(z)a(z) + O(z). \tag{2}$$

Grouping the factors in the first term of the sum as S(z)=GP(z)F(z)H(z), the entire MIMO response of the system can be represented in the z-domain and time-domain, respectively, as:

$$r(z) = S(z)a(z) + O(z) \tag{3A}$$

$$r_n = \sum_{l=-\infty}^{\infty} S_l a_{n-l} + O. \tag{3B}$$

Given the model of Eqn. (3), the joint compensation of the channel impairments (such as intersymbol interference (ISI)) and the analog front-end (AFE) errors can be formulated as the general equalization problem of a MIMO channel. Common equalization techniques include feed forward equalization, decision feedback equalization, and maximum likelihood sequence estimation.

FIG. 3 illustrates an example using maximum likelihood sequence estimation (MLSE). FIG. 3 includes a block diagram of an MLSE equalizer. The equalizer 350 includes a MIMO-FFE (C) 360 coupled to a sliding block Viterbi decoder (SBVD) 370 and a MIMO channel estimator (B) 380.

In one implementation, the MIMO-FFE 360 is described by the following equation:

$$q_n = \sum_{l=0}^{N_f - 1} C_l r_{n-l} \tag{4}$$

where $N_f$ is the number of M×M-matrix taps ($C_i$) of the forward equalizer.

Let K be the total number of bits transmitted. It is convenient to assume, without loss of generality, that K=NM with N integer. The maximum-likelihood sequence detector chooses, among the $2^K$ possible sequences, the one $\{\hat{a}_\kappa\}$ ($\kappa=1, \ldots, K$) that minimizes the metric:

$$m = \sum_{n=1}^{N} \|q_n - B(\hat{A}_n)\|^2, \tag{5}$$

where B(•) is a function that models the response of the equalized channel with memory $\Delta-1$, and $\hat{A}_n = (\hat{a}_{nM}, \hat{a}_{nM-1}, \ldots \hat{a}_{(n-1)M-\Delta+2})$. Note that each component of B(•) depends only on $\Delta$ consecutive received bits. This formulation assumes that in general the function B(•) is nonlinear. The minimization of Eqn. (5) can be efficiently implemented using the Viterbi algorithm. The required number of states of the Viterbi decoder is $S=2^{\Delta-1}$. The SBVD 370 is generally a suitable form of the Viterbi algorithm for a MIMO receiver. The input to the SBVD 370 is the FFE 360 output vector $q_n$, and the output is a block of M detected symbols $\hat{a}_n$.

For each of the M components of $B(\hat{A}_n)$, the MIMO channel estimator 380 generates the 2S expected values of the corresponding component of the $q_n$ vector for all possible combinations of the $\Delta$ most recently received bits (corresponding to the 2S branch metrics in the trellis diagram). The MIMO channel estimator 380 can be implemented using M lookup tables, each lookup table having 2S entries. While the vector $B(\hat{A}_n)$ can in general take on $2^M S$ values, dynamic programming techniques inherent in the Viterbi algorithm reduce the computational requirement to that of computing the 2MS branch metrics corresponding to the individual components of $B(\hat{A}_n)$.

The coefficients of the FFE 360 and the lookup tables can be iteratively adapted using the well known LMS algorithm, as follows for iteration j:

$$e_n = B^j(\hat{A}_n) - q_n, \quad (6)$$

$$C_i^{(j+1)} = C_i^{(j)} + \beta e_n r_{n-1}^{(T)}, \quad (7)$$

$$B^{j+1}(\hat{A}_n) = B^j(\hat{A}_n) - \gamma e_n \quad (8)$$

where $(\cdot)^T$ means transpose and $\beta$ and $\gamma$ are the algorithm step sizes of the FFE and channel estimator, respectively. The iteration number j of the LMS update is shown as a superscript. The LMS update circuitry 362 carries out this function.

Note that the absence of a reference level in Eqns. (6)-(8) defines coefficients of the FFE 360 and the channel estimator 380 only up to a scale factor. One possible way to define the scale is to set one of the coefficients of the FFE 360 to a specific value which is kept fixed (not adapted). In the 10 G example, the number of taps of the FFE 360 can be programmed by the user. This allows the user to trade performance for power consumption. For similar reasons, the number of states of the Viterbi decoder 370 can also be set by the user.

The parallel implementation of the FFE 360 is closely related to the MIMO structure. From the MIMO representation, the FFE 360 can be expanded as a convolution matrix as follows:

$$C = \begin{bmatrix} c_0^{(0)} & c_1^{(0)} & \ldots & c_{L_f-1}^{(0)} & 0 & \ldots & 0 \\ 0 & c_0^{(1)} & c_1^{(1)} & \ldots & c_{L_f-1}^{(1)} & \ldots & 0 \\ 0 & 0 & & \ldots & & & 0 \\ 0 & 0 & \ldots & c_0^{(M-1)} & c_1^{(M-1)} & \ldots & c_{L_f-1}^{(M-1)} \end{bmatrix}, \quad (9)$$

where $L_f$ is the number of taps used. Then the output samples are computed as:

$$q_n = C[r_{(nM)} r_{(nM-1)} \ldots r_{((n-1)M+L_f-1)}]^T \quad (10)$$

The parallel implementation of the FFE 360 can be represented by M FIR filters, which is precisely what Eqn. (10) represents. In the presence of mismatches in the AFE, the coefficients in different rows of Eqn. (9) are different. This effectively allows different equalization to be applied to each of the interleaved channels (although the equalization can be applied after the interleaved channels have been recombined). The MIMO structure of the Viterbi decoder 370 is also essentially identical to the parallel processing realization. The only modification is that branch metrics associated with different components of the input vector $q_n$ are computed using different components of the channel estimator function B, which is not the case in a traditional parallel implementation. Although in Eqns. (9) and (10) the implicit assumption is made that the DSP parallelization factor equals the dimension of the MIMO channel, in practice this constraint is not required.

Figure 8:
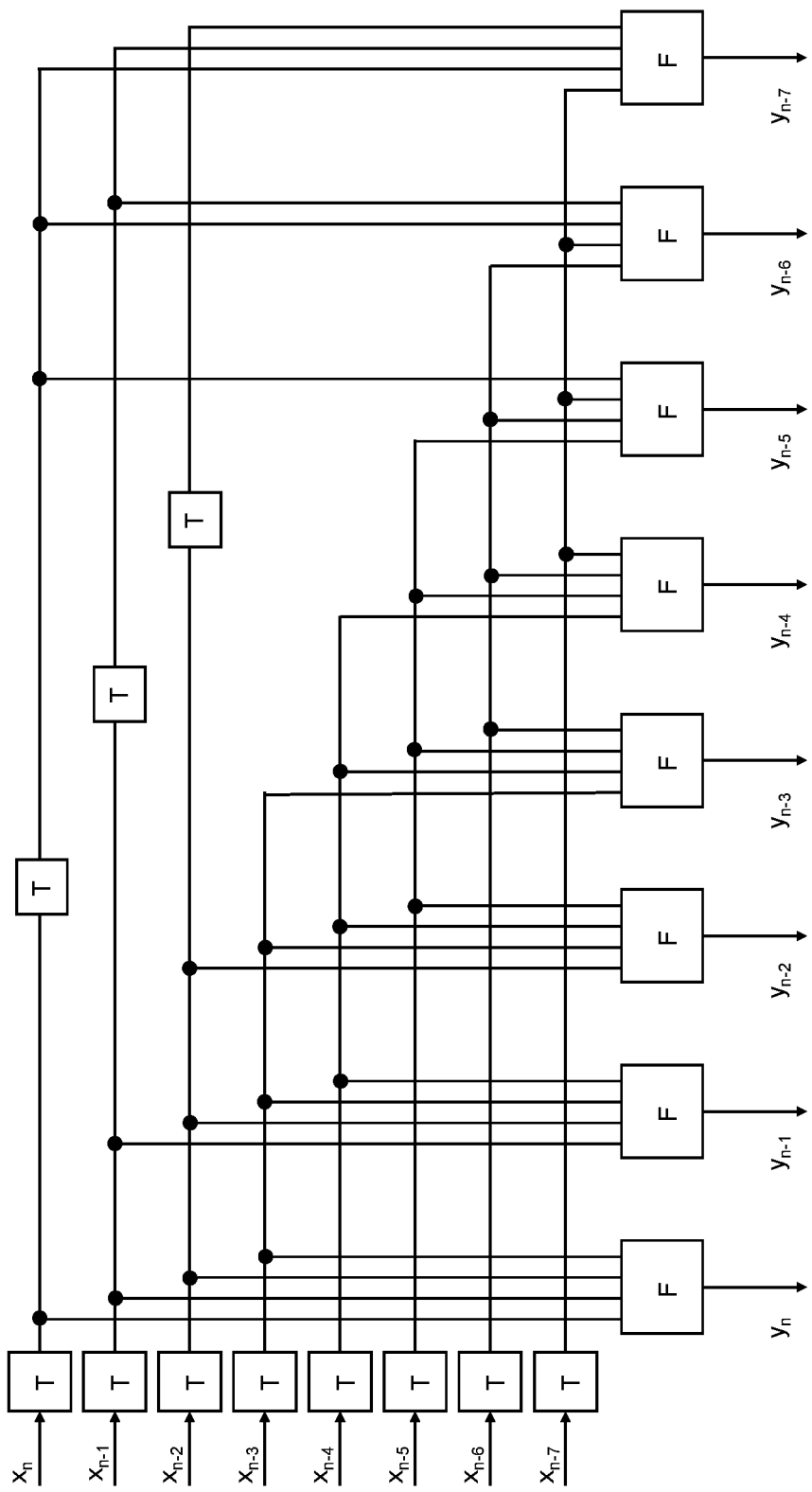
FIG. 8 is a block diagram of a 4-tap, 8-parallel FIR suitable for use with the MLSE of FIG. 3.

FIGS. 8 and 9 illustrate example implementations of parallel FIR filters suitable for implementing Eqn. (9). FIG. 8 is a block diagram of a 4-tap, 8-parallel FIR. That is, this FIR implements $L_f=4$ and $M=8$ in Eqn. (9). The $x_n$ are the input data and the $y_n$ are the filtered, output data. Note that $x_n$ and $x_{n-1}$ represent data that are spaced 1-baud period apart but consecutive samples of $x_n$ represent data that are spaced M-baud periods apart. The blocks marked T are delay lines, each of which represents a delay of M-baud periods. The blocks marked F are processing elements, each of which implements the multiply and accumulate represented by one row of the matrix in Eqn. (9).

Figure 9B:
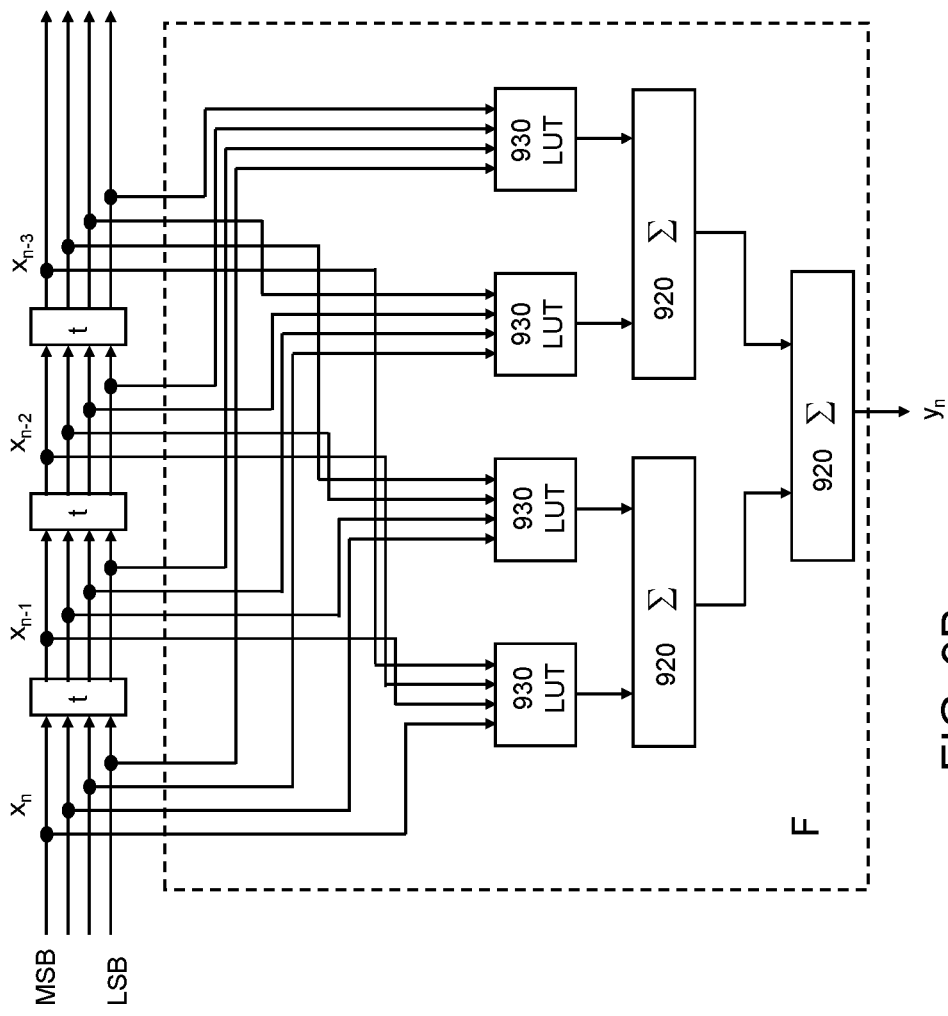
FIGS. 9A and 9B are block diagrams of different implementations of the processing elements used in the parallel FIR of FIG. 8.
Figure 9A:
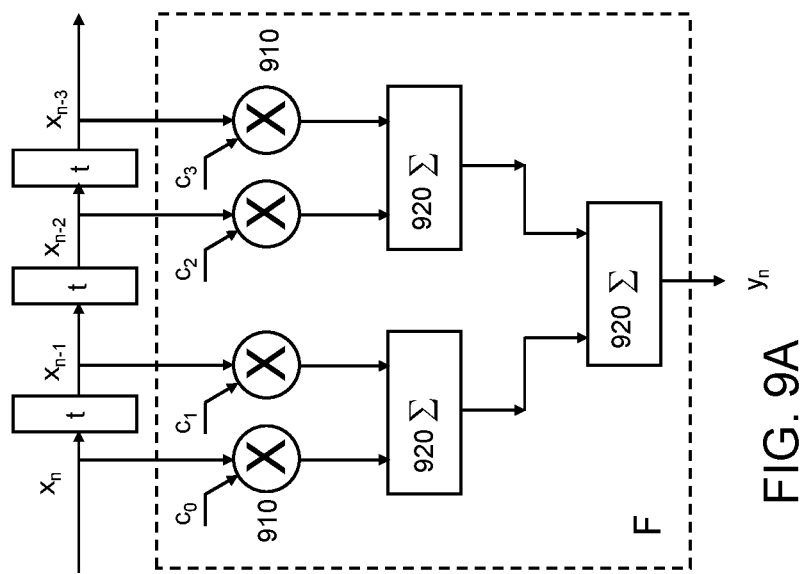

FIGS. 9A and 9B show two different implementations of the processing element F. FIG. 9A is based on a multiply-accumulate architecture. FIG. 9B is based on a lookup table-accumulate architecture. In both of these figures, the inputs $x_n$ are represented by a delay line structure, where each delay t is 1-baud period. This is merely a symbol indicating the relative timing of the inputs $x_n$, the actual implementation of the FIR may or may not have this specific delay line structure. In FIG. 9A, multipliers 910 are used to multiply the inputs xn by the tap weights cn to produce intermediate products. Adders 920 then sum the intermediate products to produce the result y. In FIG. 9B, the multipliers 910 are replaced by lookup tables 930 that output the intermediate product, but by a lookup table operation rather than by a multiplication operation.

In the 10 G example, a 25-tap, 16-parallel FIR is used. Recall that the incoming 10 G signal is decimated into 8 1.25 G signals but that the ADC channel processing each of these signals uses two ADC pipelines, one is in operation while the other is in calibration. Therefore, there are eight ADC pipelines active at any given time. Each of the eight ADC channels is demultiplexed by a factor two by the retimer 237 to allow a parallelization factor of 16 in the DSP 150. This is done to reduce the clock rate of the DSP 150. Different parallelization factors can be used in alternate embodiments. In this example, because there are only 8 independent ADC channels, the number of independent equalizers need only be 8, not 16. Therefore, each set of coefficients of the equalizer is shared by two channels of the MIMO equalizer.

Figure 10:
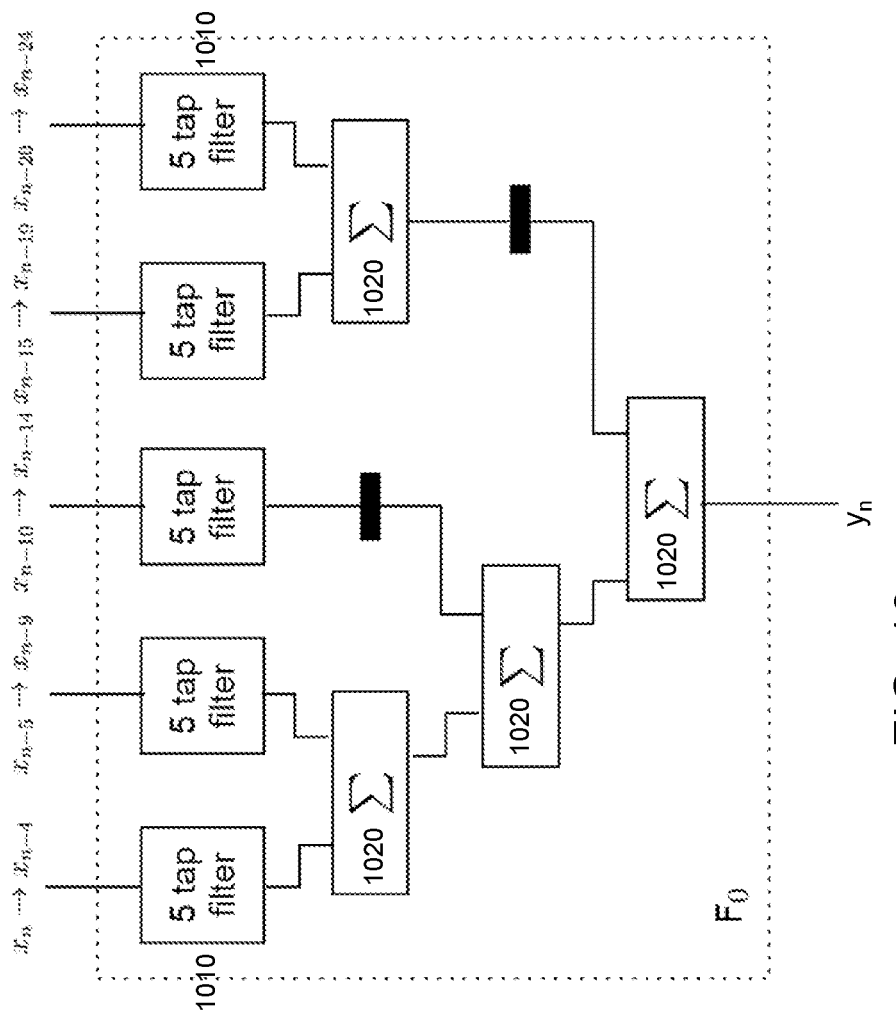
FIG. 10 is a block diagram of another FIR structure.

The basic architecture shown in FIG. 8 is used to implement this FIR. There will be 16 inputs xn and 16 outputs yn (rather than the 8 shown in FIG. 8), and 25 taps will feed each of the processing elements F (rather than the 4 shown in FIG. 8). Due to the large number of taps, the two-stage FIR structure shown in FIG. 10 is used. The 25 taps are divided into 5 groups 1010 of 5 taps each. Each group of 5 taps is implemented using a structure similar to that shown in FIG. 9B. The outputs of the 5 groups are then summed to produce the output yn. One advantage of this approach is that if less than 25 taps are used, some of the groups can be powered down in order to save energy.

In the 10 G example, the SBVD 370 can be user programmed for either 4 states or 8 states. The channel estimator 380 is implemented using a 16-term Volterra series expansion and therefore uses either 8 terms or 16 terms, depending on the number of states for the SBVD 370. The coefficient of the linear term corresponding to the most recently received bit is forced to 1 to fix the scaling factor for the channel estimator 380. In this implementation, the constant term is forced to 0 to avoid competition with other modules that remove baseline wander from the signal. In another embodiment, the "constant" term is actually adapted, therefore performing baseline wander compensation without the need for other baseline wander compensation modules. Therefore, the number of adaptive terms is 6 for a 4-state decoder and 14 for an 8-state decoder. Both the channel estimator 380 and the SBVD 370 are multi-channel in the sense that, similar to the FFE 360, they are parallelized to support separate equalization of each of the 8 ADC pipelines. Taken to the extreme, there effectively are independent parts of the channel estimator 380 and SBVD 370 for each of the 8 ADC pipelines.

In another aspect, the FFE 360 and channel estimator 380 can be adapted on a sub-sampled basis. Let R be the parallelization factor of the interleaved ADC 130 and M be the parallelization factor of the DSP 150. M may be different from R. In the 10 G examples, the baseline values are R=8 and M=16.

Referring to Eqns. (6)-(8) above, the LMS update algorithm for the FFE 360 can be written as $$c(n+1,k) = c(n,k) - \beta e(n)x(n-k) \quad (11)$$

where k is an index that identifies the equalized coefficients, n represents time, e is the slicer error, and x is the input signal. Let $$n = mM + p \text{ with } (0 \le p < M) \quad (12)$$

Then the update algorithm Eqn. (11) can be written $$c(m+1, p, k) = c(m, p, k) - \beta e(m, p)x(mM + p - k) \quad (13)$$

If the same coefficients are used to equalize all ADC channels (i.e., if multi-channel equalizer is not used), then the dependence of the coefficients on p can be dropped. The update term preferably should be summed over all ADC channels to average out the effect of sampling phase errors. In this case, Eqn. (13) reduces to $$c(m+1, k) = c(m, k) - \beta \sum_{p=0}^{M-1} e(m, p) \times (mM + p - k) \quad (14)$$

If the coefficients used to equalize different ADC channels are all independent, then update Eqn. (13) could be used. However, the speed of update can be improved by adding an update component similar to the one computed for the case of common coefficients, for example $$c(m+1, p, k) =$$
$$c(m, p, k) - \beta \sum_{q=0}^{M-1} e(m, q) \times (mM + q - k) - \gamma e(m, p) \times (mM + p - k) \quad (15)$$

In this approach, the channel-dependent update is broken into two terms: one that represents an "average" update for all channels (the β term) and one that represents each channel's deviation from the average update (the γ term). For γ=0, Eqn. (15) reduces to the case of common coefficients Eqn. (14). For β=0, it reduces to the case of entirely independent coefficients Eqn. (13).

However, note that update Eqn. (15) is not subsampled. The values of the error at all times n=mM+p are used to update the coefficients. The implementation of this approach would require relatively complex parallel processing. To reduce complexity and power dissipation, it is desirable to subsample the adaptation, in other words, to adapt the coefficients without using all samples of the error. Note that subsampling may be different for the β and γ terms of the update equation.

Let the subsampling factors for the β and γ terms of Eqn. (15) be $M_c = rM$ and $M_d = sM$, respectively, where r and s are integers greater than or equal to 1. This means that both $M_c$ and $M_d$ are greater than or equal to M, which avoids the need for parallel processing. Typically, r and s will be powers of 2. Now let z be the least common multiple of r and s. The time index n can then be written as $$n = izM + w \text{ where } (0 \le w < zM) \quad (16)$$

Substituting this into Eqn. (15) yields the subsampled update algorithm $$c[(i+1)zM, p, k] = \quad (17)$$
$$c(izM, p, k) - \beta \sum_{q=0}^{zM/r-1} e(izM + qr, q) \times [(izM + qr)M + q - k] -$$
$$\gamma e(izM + ps, p) \times [(izM + ps)M + p - k]$$

As an example, consider the case of $M_c=64$, $M_d=64$, M=16, r=4, s=4 and z=4. In this case, coefficients applied to different ADC channels can be different. Although the coefficients are updated every 1024 cycles of the baud clock, the subsampling factor of the common update term is only 64, because each update incorporates the contributions of 16 error samples. The subsampling factor of the independent terms is 64×16=1024. The processor that computes the common updates runs at ¼ of the clock rate of the DSP. The processor that computes the independent updates is shared by all interleaves.

Figure 11A:
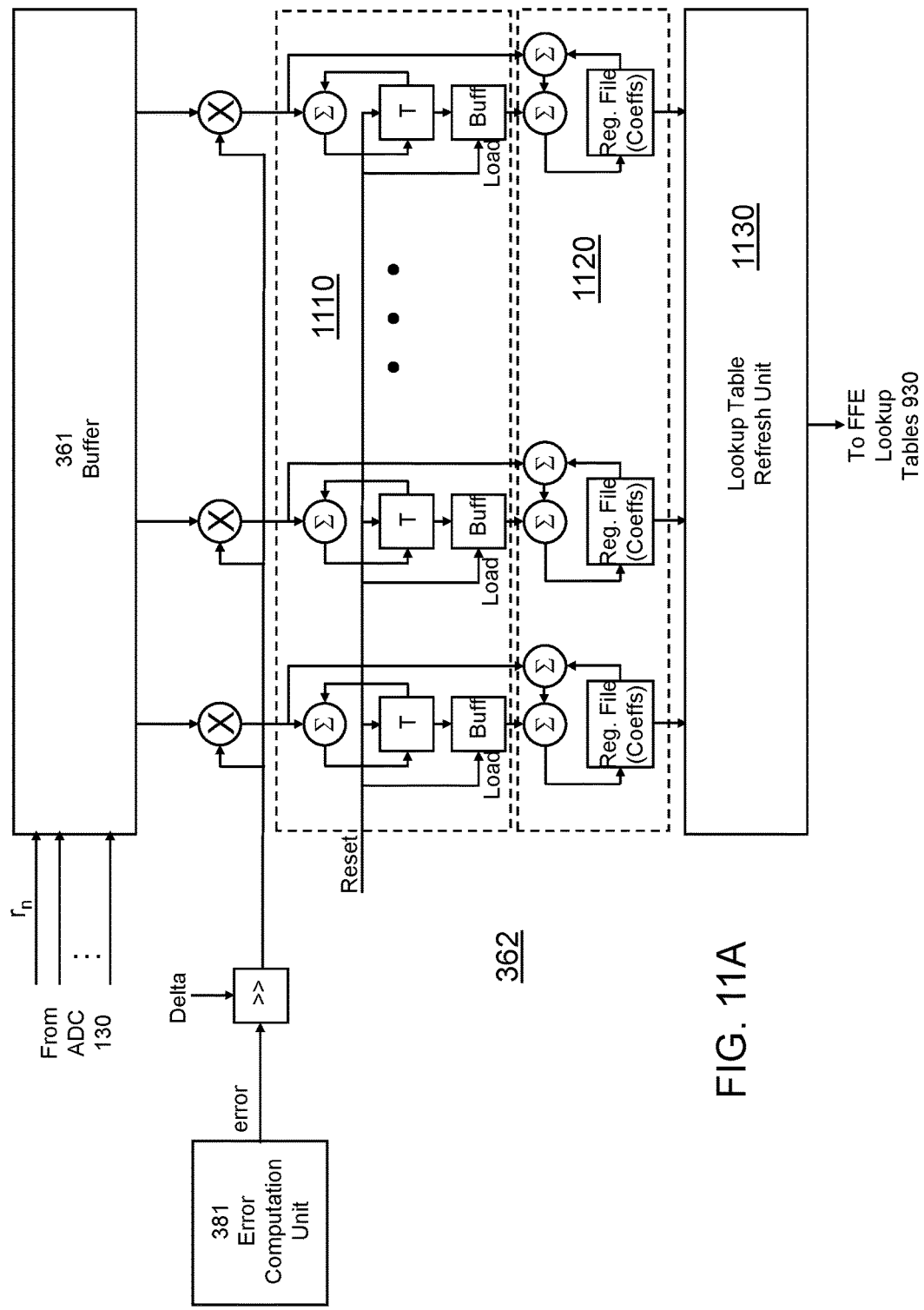
FIG. 11A is a block diagram of one implementation of the LMS adaptation engine of FIG. 3.
Figure 11B:
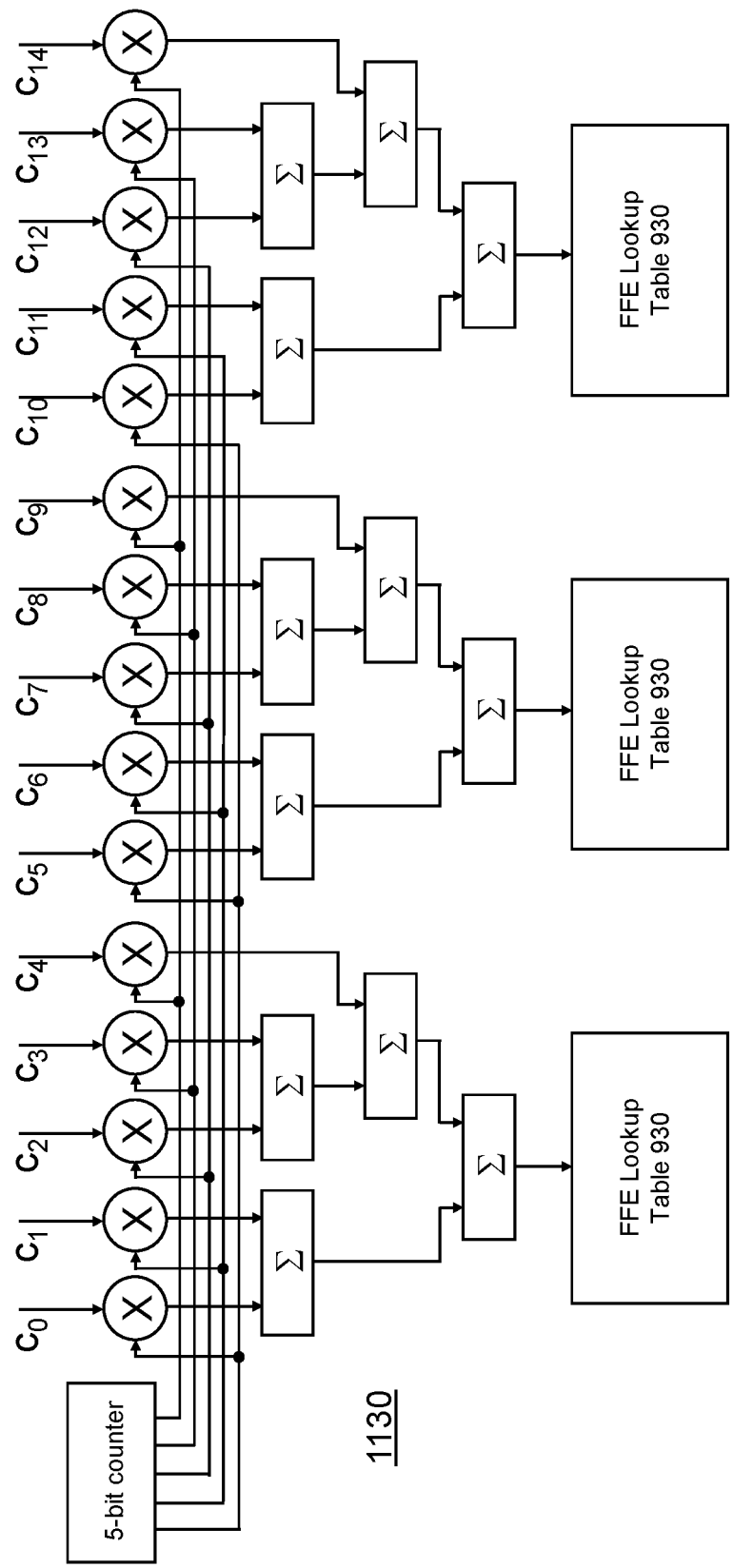
FIG. 11B is a block diagram of one implementation of the lookup table refresh unit of FIG. 11A.

FIGS. 11A-B show block diagrams of an LMS adaptation engine 362 that can implement Eqn. (17). In FIG. 11A, block 1110 calculates the common update term (the β term in Eqn. (17)) and block 1120 calculates the independent update terms (the γ term in Eqn. (17)). FIG. 11B is a block diagram of one implementation of the LUT refresh unit 1130, suitable for use with the two-stage FIR structure shown in FIG. 10. In FIG. 10, the 25-tap FFE is divided into 5 groups 1010 of 5 taps each. As described in FIG. 9B, these 5-tap filters 1010 can be implemented using lookup tables 930. The LUT refresh unit 1130 updates these lookup tables using the LMS algorithm described above. For simplicity, FIG. 11B shows a refresh unit that would update lookup tables for 3 groups of 5 taps each (rather than the 5 groups shown in FIG. 10).

The channel estimator 380 can be updated in a similar fashion. In the 10 G example, as described above, the channel estimator 380 is implemented using a 16-term Volterra series expansion. The constant term is forced to zero to avoid competition with other circuitry that compensates for baseline wander. The coefficient of the linear term corresponding to the most recently received bit is forced to 1 to fix the scaling factor for the channel estimator 380. Alternatively, the coefficient of the oldest bit could be set to 1, to force the channel estimator 380 to train to an anticausal response, which may be advantageous for some channels.

Figure 12A:
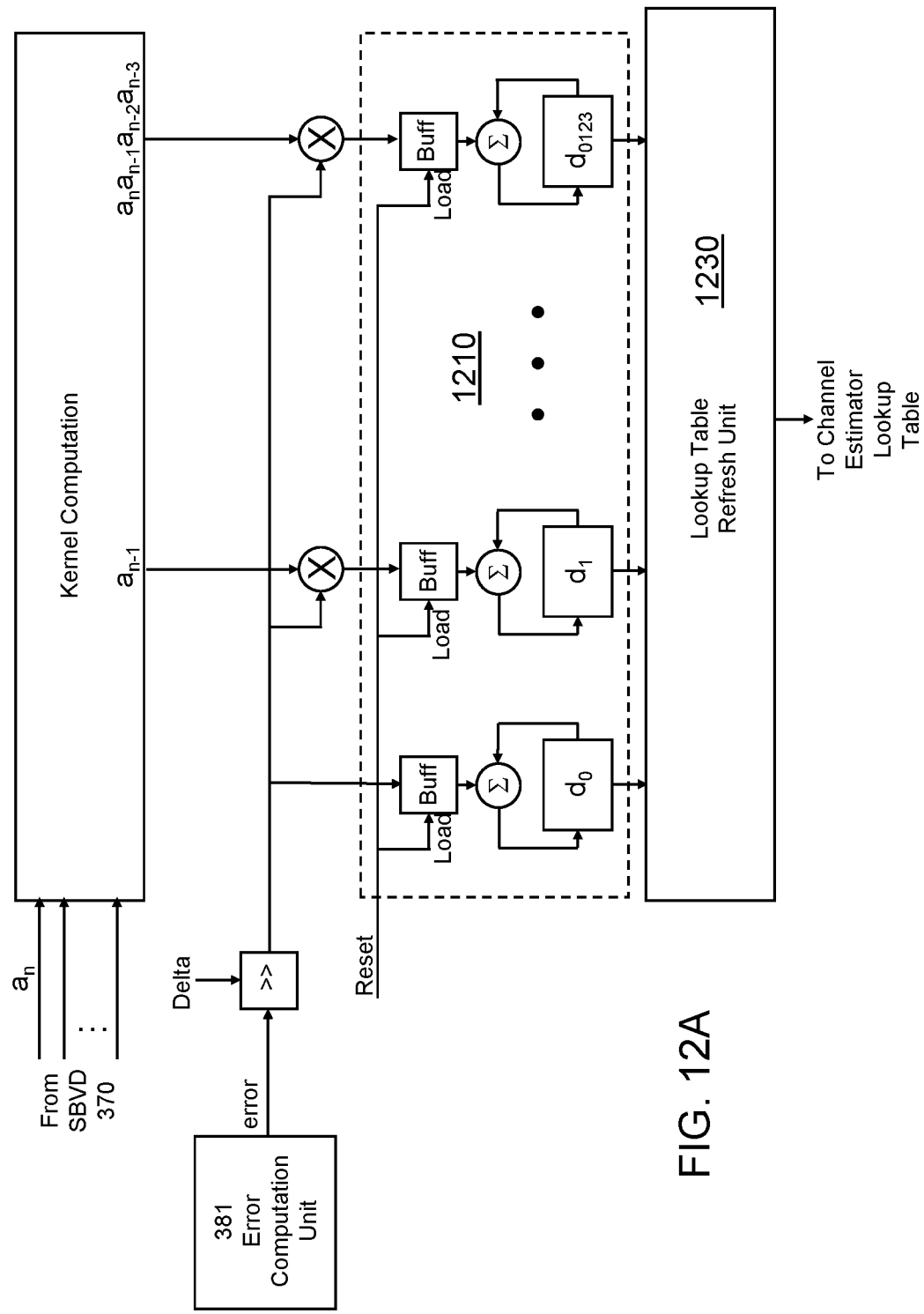
FIG. 12A is a block diagram of one implementation of the LMS adaptation engine for the channel estimator of FIG. 3.
Figure 12B:
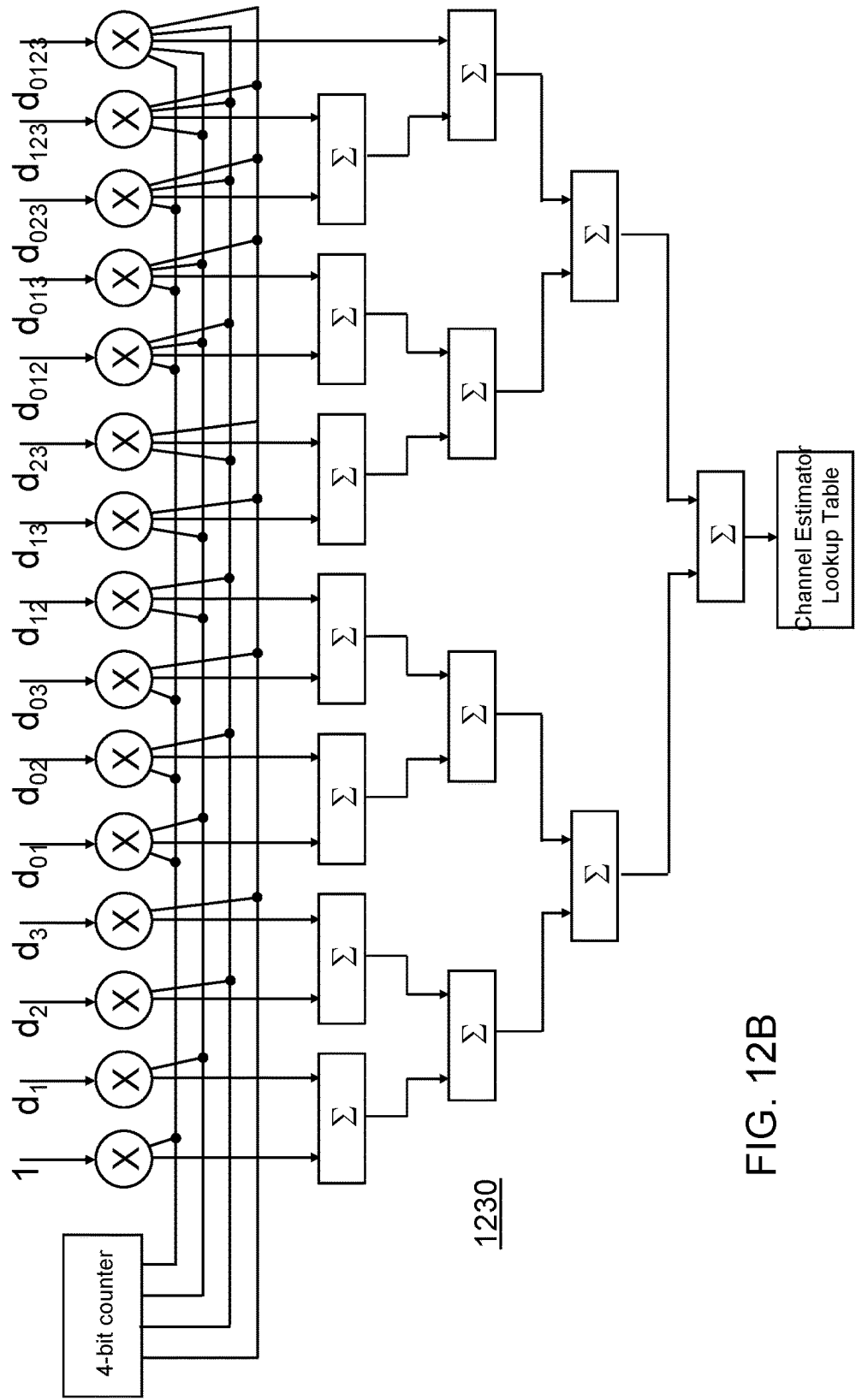
FIG. 12B is a block diagram of one implementation of the lookup table refresh unit of FIG. 12A.

The adaptation algorithm described above for the FFE 360 is also used for the channel estimator 380. Eqn. (17) can be used for the channel estimator 380, except that the sign of the two terms involving the error is plus, and the signal is replaced by decisions and products of decisions corresponding to the terms of the Volterra series expansion. FIGS. 12A-B show block diagrams of an LMS adaption engine for the channel estimator 380. The basic architecture is similar to that of the FFE adaption engine shown in FIG. 11, with the following minor modifications. The signal inputs to the multipliers are replaced by single-bit decisions or products from the Volterra series expansion and the signal buffer in FIG. 11A is replaced by a "decision buffer" whose input comes from the SBVD 370. Block 1210 calculates the update term. The LUT refresh unit 1230 can be implemented as shown in FIG. 12B, which is similar to the architecture of LUT refresh unit 1130. In the embodiment shown in FIG. 12B, note that the first coefficient of the linear term corresponding to the most recently received bit is forced to 1.

The above examples were based on MLSE and LMS, but other techniques can also be used. Multi-channel equalizers other than MLSE can also be used. Other common equalization techniques include feed forward equalization and decision feedback equalization.

As an example of one variation, the equalizer 350 in FIG. 3 may be adapted for use with single mode fiber rather than multimode fiber. In single mode fibers (SMF), noise is typically non-Gaussian and signal dependent due to the presence of the amplified spontaneous emission (ASE) noise and the photodetector. As a result of this characteristic, the performance of a MLSE which has been designed for use with multimode fibers (i.e., Gaussian channels) will degrade when used with single mode fibers. The degradation is more severe in nondispersive channels. However, the MLSE performance can be improved by adapting it for use with single mode fibers.

Mathematically, let an be the transmit bit at time instant n. The signal at the DSP input is given by $$y_n = s_n + r_n + z_n \quad (18)$$

where $s_n = f(a_n, a_{n-1}, \ldots a_{n-1+d})$ is the noise-free signal component, $r_n$ is the ASE noise in the electrical domain, and $z_n$ is the thermal Gaussian noise. Note that $s_n$ is a nonlinear function of d consecutive bits. An MLSE detector approach chooses the sequence that minimizes the cumulative metric defined by $$M = \sum_n \frac{1}{2\zeta_{s_n}} [T_{s_n}(y_n) - T_{s_n}(s_n)]^2 \quad (19)$$

where $T_s(\bullet)$ is a given signal-dependent nonlinear transformation, and $\zeta_s$ is the conditional second-order central moment of the random variable $T_s(y_n)$. In SMF channels with ASE and Gaussian noise, $T_s(y)$ is well approximated by $y^{v_s}$ with $0 < v_s \le 1$ and $y \ge 0$. For example, $v_s = 0.5$ for all s for ASE noise, and $v_s = 1$ for all s for Gaussian noise. For combined noise, typically $0.4 \le v_s < 1$ and $v_s$ typically is different for each noise-free level of s. In the presence of combined ASE and Gaussian noise (i.e., a practical situation), the implementation of the exact signal-dependent nonlinear transformation $T_s(\bullet)$ in the receiver architecture can be complex. It is advantageous to use simpler approximations in order to reduce receiver complexity.

FIG. 18 is a block diagram of an MLSE based on an approximation that either (a) the channel is Gaussian, or (b) the channel has only ASE noise is present and, therefore, $v_s = 0.5$. In the MLSE of FIG. 3, samples from the ADC are input to the FFE 360. In FIG. 18, this input path is modified to have two possible paths, illustrated by the two inputs 1810 and 1820 to the MUX. Path 1810 is the same as in FIG. 3. Samples from the ADC directly enter the FFE 360 (Gaussian channel assumed). Path 1820 is based on $v_s = 0.5$ (ASE assumed). The MUX selects whether the MLSE is run in Gaussian mode or ASE mode.

In the presence of only ASE noise (i.e., ASE mode), the random variable $y^{0.5}$ is approximately Gaussian with the same variance for all the noise-free levels s. This way, if the samples from the ADC are first processed by the SQRT transformation 1830, the rest of the receiver (FFE, MLSE, Gaussian metrics, etc.) can be designed for "normal" operation (i.e., assuming a Gaussian channel). Note that this approach involves implementing the square root transformation of the received samples before FFE. This could be implemented by using the ADC calibration tables, but different track and hold offsets might degrade the accuracy This is because these offsets might originate "different" nonlinear transformations in each ADC. Therefore, in the example of FIG. 18, an offset compensator 1840 is used prior to the SQRT transformation 1830. The offset compensator may be implemented with little additional overhead since an offset compensator is used in the timing recovery loop.

Furthermore, in the example of FIG. 18, the SQRT function 1830 is implemented by a lookup table (LUT) addressed with the samples at the output of the offset compensator. In one embodiment, a table 1832 stores the sqrt function $y^{0.5}$. The table is used to generate the content of the LUT, as explained below. LUT data generation depends on the interval of the input samples (i.e., the value of the AGC reference). For example, if the interval of the samples is between $-y_{ref}$ and $+y_{ref}$ ($y_{ref} > 0$), the content of the LUT is given by $LUT(y_n) = sqrt(y_n + y_{ref})$ with $y_n > -y_{ref}$. In one design, the timing recovery circuitry 340 (see FIG. 3) uses the samples without the SQRT transformation to avoid extra latency.

In a simplified approach, the SQRT function is approximated based on $$(y + y_{min})^v - (y_{min})^v \approx \begin{cases} \alpha_1 y, & y > 0 \\ \alpha_0 y, & y \le 0 \end{cases} \quad (20)$$

where $\alpha_0$ and $\alpha_1$ are proper constants. For channels with combined noise, $\alpha_1/\alpha_0$ varies between [0.5, 1]. Thus, further simplification can be achieved $$\alpha_1 = (0.5 + 2^{-N_1}), N_1 = T(\alpha_1 = 1), 2, 3, `\infty`(\alpha_1 = 0.5)$$

$$\alpha_0 = (1.0 + 2^{-N_0}), N_0 = 2, 3, 4, n_{bit}(\alpha_0 = 1) \quad (21)$$

This approach can achieve significant gains with low complexity, and without the use of external information. The approach could also be used with external BER information by using exhaustive search of parameters $N_0$ and $N_1$. Internal adaptation is also possible.

An alternate approach uses the samples at the output of the FFE and functions with combined noise. This scheme is based on the cumulative metric given by $$M = \sum_n \frac{1}{2\zeta_{\hat{s}_m}} [T_{\hat{s}_m}(\hat{y}_n) - T_{\hat{s}_n}(\hat{s}_n)]^2 \quad (22)$$

$$\approx \sum_n \frac{1}{2\zeta_{\hat{s}_m}} [(\hat{y}_n)^{v_{\hat{s}_n}} - (\hat{s}_n)^{v_{\hat{s}_n}}]^2$$

where the "hat" denotes samples at the FFE output. To reduce complexity, one value of $v_s$, v, is used. One criteria to select this value is that the variances $\zeta_s$ be approximately the same for all s. This way, the cumulative metric reduces to $$M \approx \Sigma_n [(\hat{y}_n)^v - (\hat{s}_n)^v]^2 \qquad (23)$$

The value v may be estimated as follows. Let $M_{2,s}$ be the conditional second-order central moment of the samples before transformation. Then, it can be shown that $\zeta_s \approx (v_s)^2 s^{2(vs-1)} M_{2,s}$. Therefore, a solution is given by $$v \approx 1 + 0.5 \frac{\log(M_{2,1}/M_{2,0})}{\log(S_0/S_1)} \qquad (24)$$

where $S_0 = f(0,0,\ldots,0)$, $S_1 = f(1,1,\ldots,1)$, and $M_{2,0}$ and $M_{2,1}$ are the respective conditional second-order central moments of the noise. Note that v=1 for Gaussian channels ($M_{2,1} = M_{2,0}$). For ASE noise, it is possible to verify that $M_{2,1}/M_{2,0} \approx S_1/S_0$ and $v \approx 0.5$. Note that this approach can address combined ASE and Gaussian noise.

Unlike the SQRT approach shown in FIG. 18, this approach works with the samples at the output of FFE 360. The transformation $y^v$ may be implemented with a LUT in the metric computation stage, prior to the square operation. The data in this LUT depends on the interval of the samples at the output of the FFE. This range varies with the noise and the channel (i.e., the FFE response).

In one implementation, it is estimated. If the interval of the samples is known, e.g. $[-y_{min}, +y_{max}]$, (with $y_{min}$, $y_{max} > 0$), the content of the LUT is generated as follows $$LUT(\hat{y}_n) = (\hat{y}_n + y_{min})^v \quad \hat{y}_n > -y_{min} \qquad (25)$$

For an automatic adaptation of the parameters v and $y_{min}$, the computation of the variances for two signal levels can be determined $$v \approx 1 + 0.5 \frac{\log(M_{2,1}/M_{2,0})}{\log(\hat{S}_0/\hat{S}_1)} \qquad (26)$$

$$\hat{S}_0 \approx y_{min} + g_0$$

$$\hat{S}_1 \approx y_{min} + g_1$$

$$y_{min} \approx 5\sqrt{M_{2,0}}$$

where $g_0$ and $g_1$ are the minimum and maximum values of the channel estimator, respectively.

In one approach, the complexity in the computation of v may be reduced by using an approximation based on $M_{2,0}$ and $M_{2,1}$. For example, for ASE and Gaussian limited cases, the approximation might be $$v = 0.5 \text{ if } M_{2,1}/M_{2,0} > K_{0.5}$$

$$v = 1.0 \text{ if } M_{2,1}/M_{2,0} < K_{0.5} \qquad (27)$$

where $K_{0.5}$ is a programmable threshold level (e.g., $K_{0.5}=1.5$). One possible implementation uses a LUT-based approach similar to the one described for FIG. 18, with different LUTs generated from different tables (one for each value of v and $y_{min}$).

In yet another approach, the nonlinear function $y^v$ can be implemented by using the approximation $$y^v \approx y^{v_{ref}}[1 + (v - v_{ref})\log(y) + 0.5(v - v_{ref})^2 (\log(y))^2] \qquad (28)$$

where $y^{v_{ref}}$ is a tabulated reference. For the case $v_{ref} = 0.5$, the nonlinear function reduces to $$y^v \rightarrow K^1 y^{0.5} + (v - 0.5)y \qquad (29)$$

where K is a given constant (e.g., $K \approx 0.85$). FIG. 19 is a block diagram illustrating calculation of the metric M of Eqn. 19, based on $T_s(y) = y^{vs}$ and the approximations leading to Eqn. 29.

As yet another example, in a nondispersive SMF channel (e.g., back-to-back test), the optimal detector reduces to a comparator with a proper threshold (offset). Thus, the optimal solution for a nondispersive SMF channel is a MLSE with a shift of the baseline. On nondispersive channels, the threshold can be analytically approximated from the parameter v for equal noise power as follows $$thr \approx [0.5((S_0)^v + (S_1)^v)]^{1/v}, \quad S_0, S_1 > 0, \qquad (30)$$

where $s_0$ and $s_1$ are the noise-free signals. The parameter v may be estimated as described above.

Figure 13A:
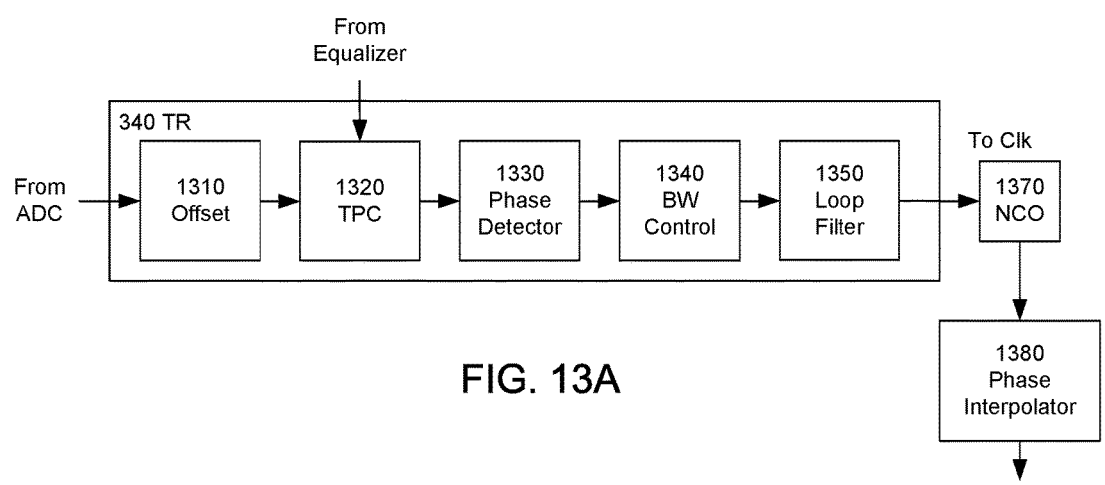
FIGS. 13A-13C and 14 are block diagrams of different implementations of the timing recovery circuit of FIG. 3.

Referring again to FIG. 3, FIGS. 13A-13C illustrate a block diagram of one implementation of the timing recovery circuitry 340. As shown in FIG. 13A, this example includes circuitry to implement each of the following: offset compensation 1310, timing phase correction 1320, phase detection 1330, bandwidth control 1340 and a loop filter 1350. The output of the timing recovery circuitry 340 drives the sampling clock generator 140, which in this example includes a numerically controlled oscillator (NCO) 1370 and phase interpolator 1380.

Figure 13B:
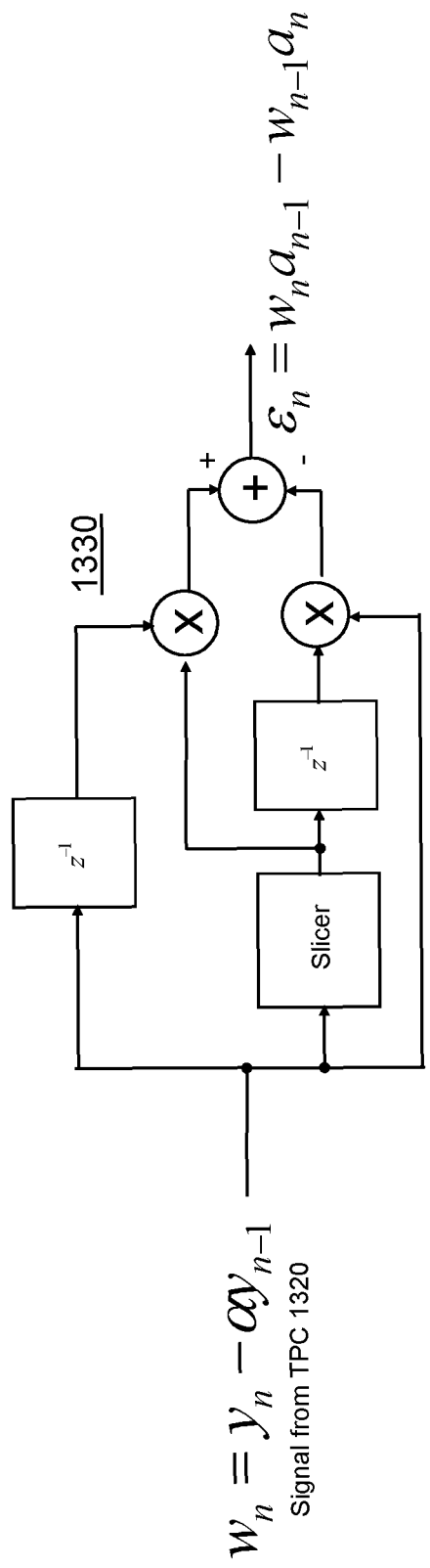

The timing recovery circuitry 340 operates as follows. The signal from the ADC may have a non-zero offset. The offset compensation 1310 is circuitry that tracks this baseline wander and removes (or reduces) it. The timing phase corrector 1320 introduces a controlled amount of ISI by using a filter with z-transform of $F(z) = 1 - \alpha z^{-1}$, where $|\alpha| \ll 1$ is adjusted dynamically to minimize the error signal from the multi-channel equalizer 350. The phase detector 1330 is based on a modified Mueller and Muller algorithm, based on pseudo-decisions derived directly from the input signal before equalization as shown in FIG. 13B.

Figure 13C:
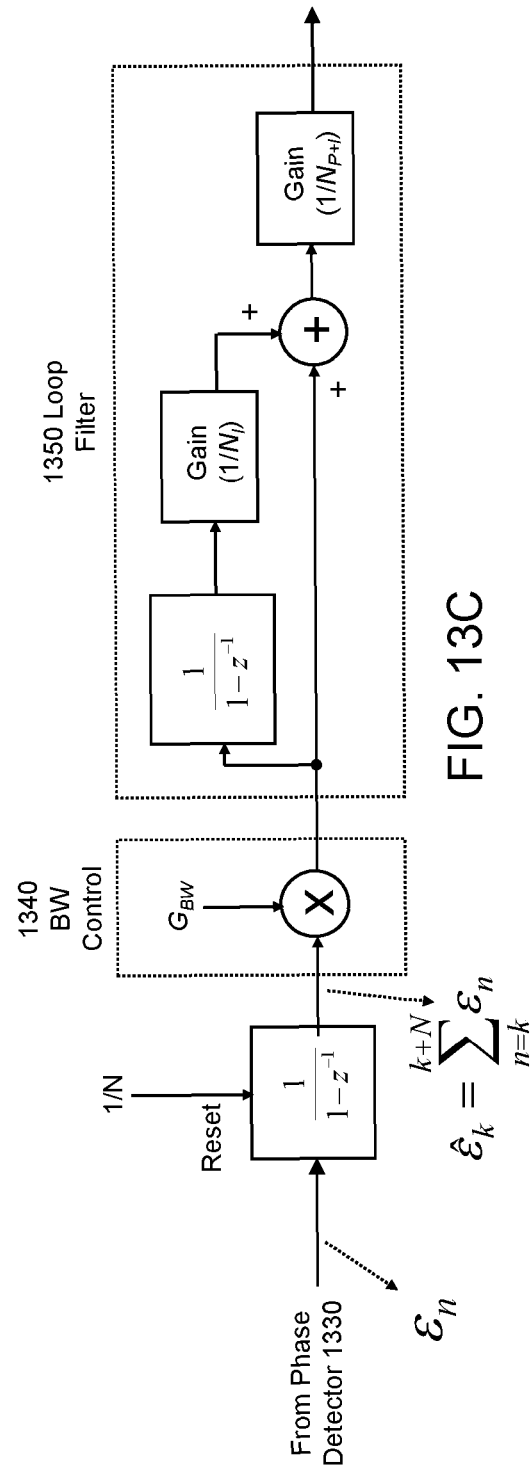

As shown in FIG. 13C, the bandwidth control 1340 is achieved by multiplying the signal from the phase detector 1330 by an adjustable gain $G_{BW}$. The loop gain can be roughly estimated based on the difference between a central tap and a lateral tap. If the central tap and lateral tap are closer in magnitude, this suggests that the loop gain is low. Conversely, if the central tap and lateral tap differ more in magnitude, this suggests that the loop gain is high. In one approach, the gain $G_{BW}$ is set as $G_{BW} = K_{BW}/|c_0 - c_1|$, where $K_{BW}$ is a constant set by the desired closed-loop bandwidth and $c_0$ and $c_1$ are estimates of the central tap and lateral tap, respectively. Loop filter 1350 is a standard loop filter (e.g., a proportional-plus-integral filter).

Figure 14:
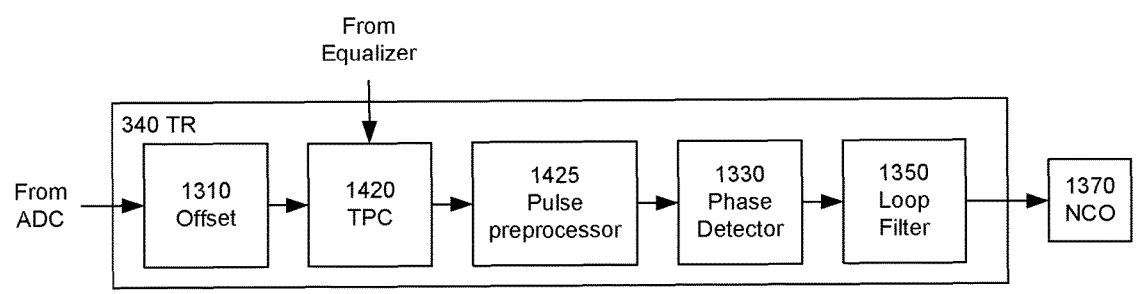

FIG. 14 is a block diagram of an alternate embodiment of the timing recovery circuitry 340. In certain cases, the impulse response of the communications channel 110 may change significantly, including varying between causal and anti-causal. For example, these types of changes may occur due to launch polarization or fiber movement in MMFs. Regardless of the cause, these types of changes may seriously affect the performance of timing recovery loops based on the Mueller and Muller approach.

FIG. 14 is similar to FIG. 13, except certain changes are made to allow better tracking of the received signal in time variant channels. There are two main differences. First, the timing phase corrector 1420 uses three samples, rather than two. The filter is a "nearly all-pass" filter with z-transform of $F(z) = (1 + \alpha z)/(1 + \alpha z^{-1}) \approx \alpha + z^{-1} - \alpha z^{-2}$, with $|\alpha| \ll 1$ adjusted dynamically to minimize the error signal from the multi-channel equalizer 350. Second, a 3-tap FIR filter (pulse preprocessor 1425) is introduced, with z-transform of $G(z)=0.5+z^{-1}+0.5z^{-2}$. This provides a more suitable pulse for phase detection based on the M&M algorithm. It also allows the elimination of the automatic bandwidth control 1340.

In one approach, the timing recovery circuitry 340 is implemented in a parallel manner. Rather than processing one serial stream at 10 G, the incoming data is decimated into eight parallel streams of 1.25 G each. This allows the clocks (e.g., for the phase detector 1330) to run at the 1.25 G rate (actually 1.288 GHz clock) rather than at a 10 G rate.

Figure 15:
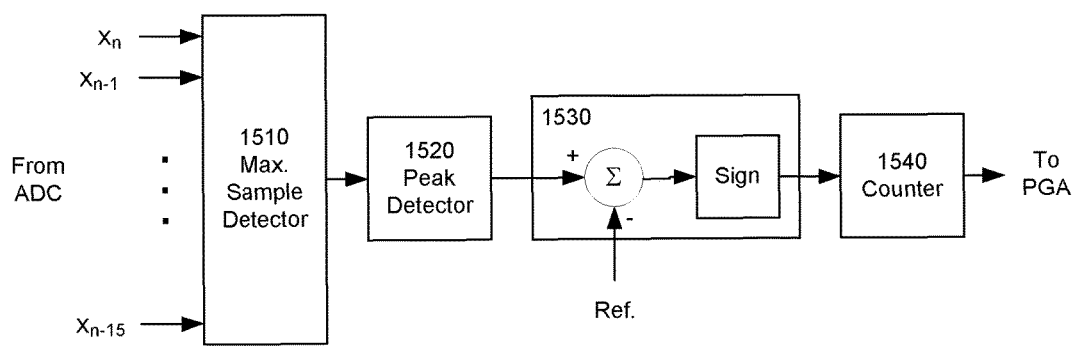
FIG. 15 is a block diagram of an implementation of the automatic gain control circuit of FIG. 3.

FIG. 15 is a block diagram of AGC 320. This example includes a maximum sample detector 1510 followed by a peak detector 1520, a one-bit quantizer 1530 and a counter 1540. The max sample detector 1510 receives the samples from the 16 ADC pipeline channels of the interleaved ADC 130 (of which only eight are active at any one time) and detects the signal peak from among the samples. The peak detector 1520 processes this output using two filters with different time constants. If the signal peak is greater than the peak detector output, then the filter with the shorter time constant is used. Otherwise, the filter with the longer time constant is used. This allows the peak detector output to increase quickly (fast attack) but degrade with a longer time constant (slow release).

The quantizer 1530 receives the output of the peak detector 1520. It compares the output to a reference value and generates a 1 or 0 depending on whether the output is greater than or less than the reference. This 1/0 signal is used to adjust the gain of the PGA 120. In one approach, the AGC is divided into a coarse gain and a fine gain. The 1/0 signal is used initially to set the coarse gain and then used on a continuous basis to set the fine gain via counter 1540.

Figure 16:
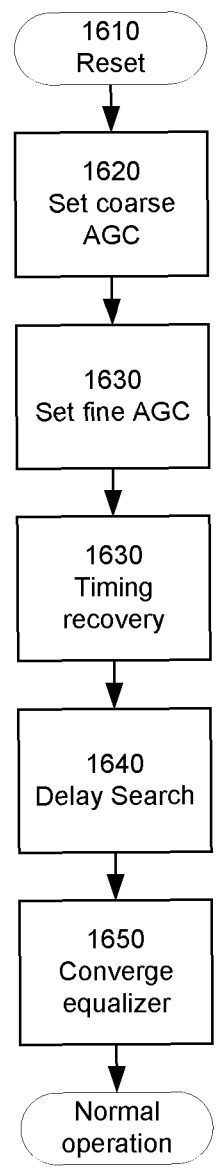
FIG. 16 is a flow diagram illustrating a start-up sequence for the receiver of FIG. 1.

FIG. 16 is a flow diagram illustrating a start-up sequence for the receiver 115. The chip begins by resetting 1610 all functional blocks, including coarse and fine AGC 320, timing recovery 340 and multi-channel equalizer 350. In one implementation, the different ADC pipelines for the interleaved ADC 130 are also calibrated during reset 1610. Reset 1610 can occur upon power up or upon some error state. To reacquire signal, the chip begins by setting 1620 the coarse AGC 320 followed by setting 1625 the fine AGC 320. The timing recovery circuitry 340 then acquires 1630 phase lock with the incoming signal.

The best delay search 1640 converges the multi-channel equalizer 350 using the available cursor delays in the FFE 360. In an alternate embodiment, the best delay search 1640 converges the equalizer 350 using all the available delays in the FFE 360 and all the available delays in the linear part of the channel estimator 380. For each convergence, the mean squared error (MSE) obtained from error signal (Eqn. 6) is stored. Once all available delays are swapped, the best delay search 1640 selects the delays which yielded the minimum MSE. The multi-channel equalizer 350 is then converged 1660 using the cursor delays determined by the delay search 1640. After that, the chip operates in a normal mode.

The approach described has many advantages. For example, many of the functions have been chosen to allow maximum implementation on a DSP chip 150. The 10 G example results in an all-DSP (other than the analog front end) electronic dispersion compensation receiver for the 10 GBASE-LRM application. The functions shown in DSP 150 of FIG. 3 are suitable for single chip implementation in standard 90 nm CMOS technology using current technology. Implementation using standard CMOS technology also allows the more complete integration of functionality. The use of an interleaved ADC allows each ADC pipeline to operate at a slower clock rate. The use of the pipelined ADC architecture with open-loop residue amplifiers coupled with continuously calibrated, non-linear correction results in lower power consumption and faster operation without sacrificing accuracy. The use of digital calibration for the ADC pipelines allows much of this functionality to be moved to the DSP. The multi-channel equalizer is tolerant to channel-to-channel variations in the interleaved ADC front end. The receiver architecture is also generally tolerant to significant amounts of channel dispersion and nonlinear channel response. The timing recovery circuitry allows for robust operation even on time-varying channels, including high-dispersion multimode fibers. Not all of the features must be used in all implementations. Depending on the application, various embodiments may include only some of the features and/or benefits.

The examples described above generally concern the receiver. However, in many 10 G and other applications, the communication links are bidirectional and the receiver and transmitter at each end of the link are housed in a single transceiver module. In some applications, these modules are fixed to a host circuit board, and in other applications they are "pluggable" modules that can be inserted into and removed from a cage (or socket) that is fixed to the host circuit card. Multi-Source Agreements (MSAs) have been developed to achieve some degree of interoperability between modules from different manufacturers. Example MSAs include XFP and SFP+, in which the 10 Gbps electrical I/O interface to the host is serial, and X2, XPAK, and XENPAK, in which the 10 Gbps electrical interface to the host is parallelized to four lanes in each direction. The receivers described above are well suited for inclusion in these types of transceiver modules.

Figure 17:
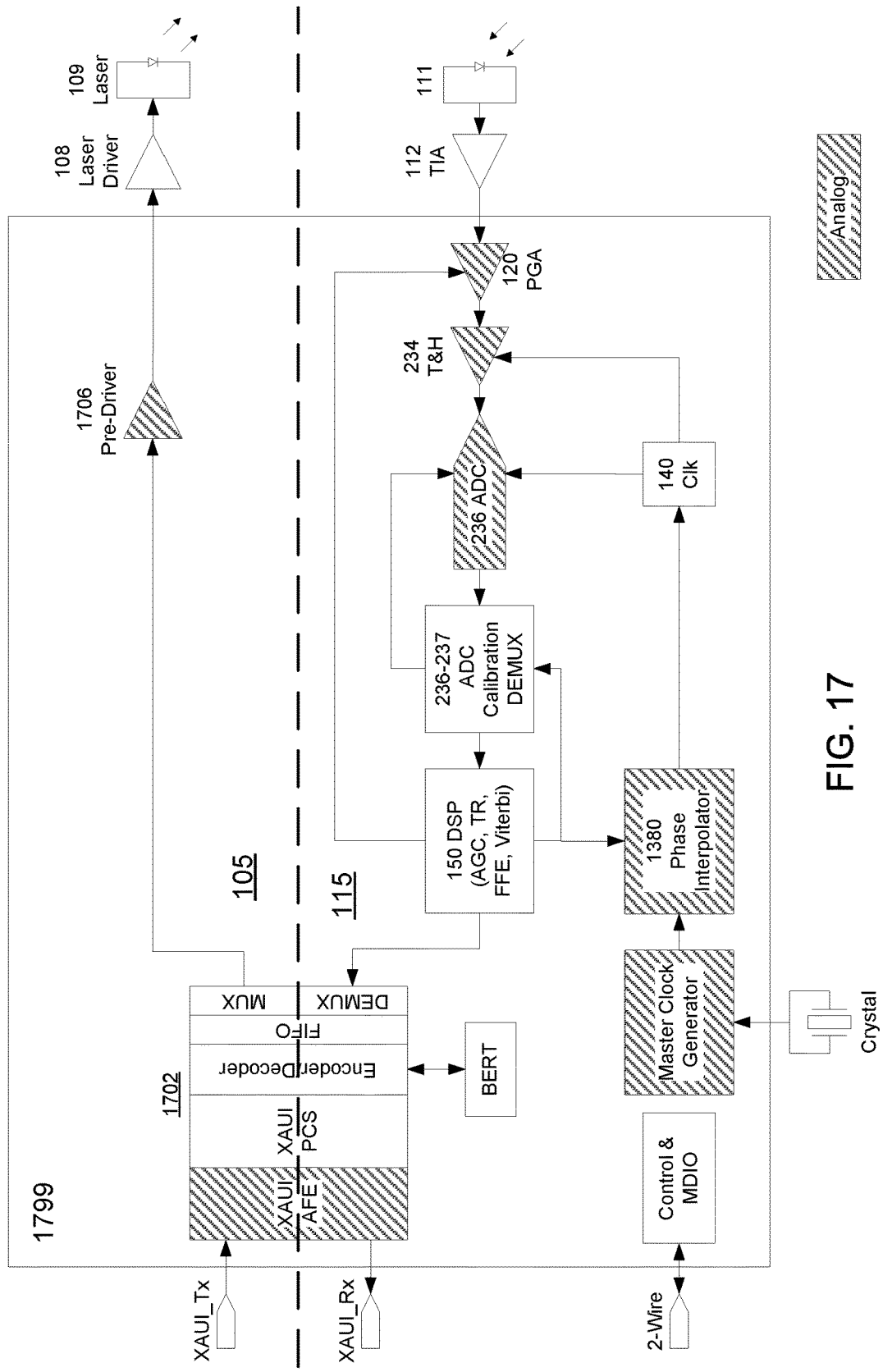
FIG. 17 is a block diagram of a transceiver module using the receiver of FIGS. 1-16.

FIG. 17 is a block diagram of a transceiver module that includes both a transmitter and a receiver as described above. This module uses the XAUI interface (IEEE 802.3ae Standard, Clause 47: XGMII Extender Sublayer (XGXS) and 10 Gigabit Attachment Unit Interface (XAUI), published by the Institute of Electrical and Electronic Engineers Inc, 2002) to the rest of the system. The transmitter 105 includes the XAUI interface electronics 1702, pre-driver 1706, laser driver 108 and laser 109. The receiver 120 includes photodetector 111, TIA 112 and then the components described above. Shown in FIG. 17 are the PGA 120, track-and-hold units 234, ADC 236-237, DSP 150 (which includes all of the components shown in FIG. 3), phase interpolator 1380 and sampling clock generator 140. In this example, all components shown inside block 1799 are implemented as a single integrated circuit. Analog components on the chip 1799 are identified by the diagonal striping.

Although the detailed description contains many specifics, these should not be construed as limiting the scope of the invention but merely as illustrating different examples and aspects of the invention. It should be appreciated that the scope of the invention includes other embodiments not discussed in detail above. For example, the functionality has been described above as implemented primarily in electronic circuitry. This is not required, various functions can be performed by hardware, firmware, software, and/or combinations thereof. Depending on the form of the implementation, the "coupling" between different blocks may also take different forms. Dedicated circuitry can be coupled to each other by hardwiring or by accessing a common register or memory location, for example. Software "coupling" can occur by any number of ways to pass information between software components (or between software and hardware, if that is the case). The term "coupling" is meant to include all of these and is not meant to be limited to a hardwired permanent connection between two components. In addition, there may be intervening elements. For example, when two elements are described as being coupled to each other, this does not imply that the elements are directly coupled to each other nor does it preclude the use of other elements between the two. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A receiver comprising:
an analog-to-digital converter (ADC) that generates signal samples from a received signal having combined non-Gaussian noise and Gaussian noise;
wherein the ADC is a pipelined ADC including an input track-and-hold stage followed by a plurality of low resolution ADC stages, each ADC stage including
  a 1-bit comparator coupled to the input track-and-hold stage,
  a 1-bit digital-to-analog converter (DAC) coupled to the 1-bit comparator,
  an analog subtractor coupled to the 1-bit DAC and the input track-and-hold stage,
  a residue amplifier coupled to the analog subtractor, and
  a track-and-hold circuit coupled to the residue amplifier;
a feedforward equalizer coupled to receive the signal samples from the ADC, and to apply equalization to generate equalized samples;
a decoder coupled to an output of the feedforward equalizer, the decoder determining detected symbols from the equalized samples and a channel model by minimizing a cumulative metric that compensates the combined Gaussian and non-Gaussian noise in the received signal; and
a channel estimator to receive the output of the feedforward equalizer and an output of the decoder and to generate the channel model and an error feedback signal to adaptively update coefficients of the feedforward equalizer based on the error feedback signal;
wherein the ADC is configured in a sub-radix architecture having more ADC stages than there are bits in the received signal.

2. The receiver of claim 1 wherein the residue amplifiers of the ADC stages include open-loop amplifiers.

3. A receiver comprising:
an analog-to-digital converter (ADC) that generates signal samples from a received signal having combined non-Gaussian noise and Gaussian noise;
wherein the ADC is a pipelined ADC including an input track-and-hold stage followed by a plurality of low resolution ADC stages, each ADC stage including
  a 1-bit comparator coupled to the input track-and-hold stage,
  a 1-bit digital-to-analog converter (DAC) coupled to the 1-bit comparator,
  an analog subtractor coupled to the 1-bit DAC and the input track-and-hold stage,
  a residue amplifier coupled to the analog subtractor, and
  a track-and-hold circuit coupled to the residue amplifier;
a feedforward equalizer coupled to receive the signal samples from the ADC, and to apply equalization to generate equalized samples;
a decoder coupled to an output of the feedforward equalizer, the decoder determining detected symbols from the equalized samples and a channel model by minimizing a cumulative metric that compensates the combined Gaussian and non-Gaussian noise in the received signal; and
a channel estimator to receive the output of the feedforward equalizer and an output of the decoder and to generate the channel model and an error feedback signal to adaptively update coefficients of the feedforward equalizer based on the error feedback signal;
wherein the cumulative metric is approximated by $M \approx \Sigma_n [(\hat{y}_n)^v - (\hat{s}_n)^v]^2$ where M is the cumulative metric, $\hat{y}_n$ represents a sample at the output of the feedforward equalizer, $\hat{s}_n$ is a noise-free signal component of $\hat{y}_n$, where $0 < v \leq 1$.

4. The receiver of claim 3, where v is given by $$v \approx 1 + 0.5 \frac{\log(M_{2,1}/M_{2,0})}{\log(S_0/S_1)},$$

where $M_{2,0}$ and $M_{2,1}$ are conditional second-order central moments of noise and where $S_0 = f(0, 0, \ldots, 0)$, $S_1 = f(1, 1, \ldots, 1)$.

5. The receiver of claim 3 further comprising:
a transformation block to provide an approximate solution to $(\hat{y}_n)^v$, wherein the transformation block implements a function $LUT(\hat{y}_n) = (\hat{y}_n + y_{min})^v$ when the sample $\hat{y}_n$ is in an interval between $-y_{min}$ and $+y_{max}$, where $y_{min}$ and $y_{max}$ are the minimum and maximum values of the interval of the sample $\hat{y}_n$, respectively.

6. A receiver comprising:
an analog-to-digital converter (ADC) that generates signal samples from a received signal having combined non-Gaussian noise and Gaussian noise;
wherein the ADC is a pipelined ADC including an input track-and-hold stage followed by a plurality of low resolution ADC stages, each ADC stage including
  a 1-bit comparator coupled to the input track-and-hold stage,
  a 1-bit digital-to-analog converter (DAC) coupled to the 1-bit comparator,
  an analog subtractor coupled to the 1-bit DAC and the input track-and-hold stage,
  a residue amplifier coupled to the analog subtractor, and
  a track-and-hold circuit coupled to the residue amplifier;
a feedforward equalizer coupled to receive the signal samples from the ADC, and to apply equalization to generate equalized samples;
a decoder coupled to an output of the feedforward equalizer, the decoder determining detected symbols from the equalized samples and a channel model by minimizing a cumulative metric that compensates the combined Gaussian and non-Gaussian noise in the received signal; and
a channel estimator to receive the output of the feedforward equalizer and an output of the decoder and to generate the channel model and an error feedback signal to adaptively update coefficients of the feedforward equalizer based on the error feedback signal;
wherein the ADC further includes a look-up table (LUT) configured to the plurality of ADC stages to store the inverses of non-linear characteristics of the signal samples.

7. A receiver comprising:
an analog-to-digital converter (ADC) that generates signal samples from a received signal having combined non-Gaussian noise and Gaussian noise;
wherein the ADC is a pipelined ADC including an input track-and-hold stage followed by a plurality of low resolution ADC stages, each ADC stage including
a 1-bit comparator coupled to the input track-and-hold stage,
a 1-bit digital-to-analog converter (DAC) coupled to the 1-bit comparator,
an analog subtractor coupled to the 1-bit DAC and the input track-and-hold stage,
a residue amplifier coupled to the analog subtractor, and
a track-and-hold circuit coupled to the residue amplifier;
a feedforward equalizer coupled to receive the signal samples from the ADC, and to apply equalization to generate equalized samples;
a decoder coupled to an output of the feedforward equalizer, the decoder determining detected symbols from the equalized samples and a channel model by minimizing a cumulative metric that compensates the combined Gaussian and non-Gaussian noise in the received signal; and
a channel estimator to receive the output of the feedforward equalizer and an output of the decoder and to generate the channel model and an error feedback signal to adaptively update coefficients of the feedforward equalizer based on the error feedback signal;
wherein the ADC further includes a lookahead pipeline configuration in which one or more of the plurality of ADC stages includes a pair of comparators configured to enable parallel interstage amplification and comparator operations.

8. A method for equalizing a received signal, the method comprising:
generating, by an analog-to-digital converter (ADC), signal samples from the received signal having combined non-Gaussian noise and Gaussian noise;
wherein the ADC is a pipelined ADC including an input track-and-hold stage followed by a plurality of low resolution ADC stages, each ADC stage including
a 1-bit comparator coupled to the input track-and-hold stage,
a 1-bit digital-to-analog converter (DAC) coupled to the 1-bit comparator,
an analog subtractor coupled to the 1-bit DAC and the input track-and-hold stage,
a residue amplifier coupled to the analog subtractor, and
a track-and-hold circuit coupled to the residue amplifier;
wherein generating signal samples by the ADC includes generating 1-bit of each sample through each of the ADC stages according to the following:
determining, by the comparator, a contribution voltage from the received signal;
developing, by the analog subtractor, a residue by subtracting the contribution voltage from the received signal;
multiplying, by the residue amplifier, the residue by a gain value; and
holding, by the track-and-hold circuit, the residue;
applying, by a feedforward equalizer, an equalization to the signal samples from the ADC to generate equalized samples;
determining, by a decoder coupled to an output of the feedforward equalizer, detected symbols from the equalized samples and a channel model by minimizing a cumulative metric that compensates the combined Gaussian and non-Gaussian noise in the received signal; and
generating, by a channel estimator, the channel model and an error feedback signal to adaptively update coefficients of the feedforward equalizer based on the error feedback signal.

9. The method of claim 8 wherein the cumulative metric is approximated by $M \approx \Sigma_n [(\hat{y}_n)^v - (\hat{s}_n)^v]^2$ where M is the cumulative metric, $\hat{y}_n$ represents a sample at the output of the feedforward equalizer, $\hat{s}_n$ is a noise-free signal component of $\hat{y}_n$, where $0 < v \leq 1$.

10. The method of claim 8, where v is given by $$v \approx 1 + 0.5 \frac{\log(M_{2,1}/M_{2,0})}{\log(S_0/S_1)},$$

where $M_{2,0}$ and $M_{2,1}$ are conditional second-order central moments of noise and where $S_0 = f(0,0,\ldots,0)$, $S_1 = f(1,1,\ldots,1)$.

11. The method of claim 10 further comprising:
providing an approximate solution to $(\hat{y}_n)^v$ by implementing a function $LUT(\hat{y}_n) = (\hat{y}_n + y_{min})^v$ when the sample $\hat{y}_n$ is in an interval between $-y_{min}$ and $+y_{max}$, where $y_{min}$ and $y_{max}$ are the minimum and maximum values of the interval of the sample $\hat{y}_n$, respectively.

12. The method of claim 8 further comprising
storing, by a look-up table (LUT) of the ADC further configured to the plurality of ADC stages, the inverses of non-linear characteristics of the signal samples.

13. The method of claim 8 wherein generating signal samples includes
performing, by the ADC, interstage amplification and comparator operations in parallel.

14. The method of claim 8 wherein generating signal samples includes generating redundancies by the ADC configured in a sub-radix architecture having more ADC stages than there are bits in the received signal.

15. The method of claim 8 wherein multiplying the residue by a gain value includes multiplying the residue by the gain value by open-loop residue amplifiers.

16. A transceiver chip for communication over an optical fiber, the transceiver chip comprising:
a host interface for providing encoded data in a host format for transmitting over the optical fiber and for receiving decoded data in the host format originating from the optical fiber;
transmit path circuitry to receive the encoded data from the host interface and generate an electrical signal suitable for driving a laser coupled to the optical fiber;
an input port for receiving a received signal originating from the optical fiber having combined non-Gaussian noise and Gaussian noise; and receive path circuitry coupled between the input port and the host interface, the receive path circuitry comprising:
an analog-to-digital converter (ADC) that generates signal samples from the received signal having the combined non-Gaussian noise and Gaussian noise;
wherein the ADC is a pipelined ADC including an input track-and-hold stage followed by a plurality of low resolution ADC stages, each ADC stage including
a 1-bit comparator coupled to the input track-and-hold stage,
a 1-bit digital-to-analog converter (DAC) coupled to the 1-bit comparator,
an analog subtractor coupled to the 1-bit DAC and the input track-and-hold stage,
a residue amplifier coupled to the analog subtractor, and
a track-and-hold circuit coupled to the residue amplifier;
a feedforward equalizer coupled to receive the signal samples from the ADC, and to apply equalization to generate equalized samples;
a decoder coupled to an output of the feedforward equalizer, the decoder determining detected symbols from the equalized samples and a channel model by minimizing a cumulative metric that compensates the combined Gaussian and non-Gaussian noise in the received signal, the decoder to generate the decoded data; and
a channel estimator to receive the output of the feedforward equalizer and an output of the decoder and to generate the channel model and an error feedback signal to adaptively update coefficients of the feedforward equalizer based on the error feedback signal;
wherein the ADC is configured in a sub-radix architecture having more ADC stages than there are bits in the received signal.

17. The transceiver chip of claim 16 wherein the residue amplifiers of the ADC stages include open-loop amplifiers.

18. A transceiver chip for communication over an optical fiber, the transceiver chip comprising:
a host interface for providing encoded data in a host format for transmitting over the optical fiber and for receiving decoded data in the host format originating from the optical fiber;
transmit path circuitry to receive the encoded data from the host interface and generate an electrical signal suitable for driving a laser coupled to the optical fiber;
an input port for receiving a received signal originating from the optical fiber having combined non-Gaussian noise and Gaussian noise; and
receive path circuitry coupled between the input port and the host interface, the receive path circuitry comprising:
an analog-to-digital converter (ADC) that generates signal samples from the received signal having the combined non-Gaussian noise and Gaussian noise;
wherein the ADC is a pipelined ADC including an input track-and-hold stage followed by a plurality of low resolution ADC stages, each ADC stage including
a 1-bit comparator coupled to the input track-and-hold stage,
a 1-bit digital-to-analog converter (DAC) coupled to the 1-bit comparator,
an analog subtractor coupled to the 1-bit DAC and the input track-and-hold stage,
a residue amplifier coupled to the analog subtractor, and
a track-and-hold circuit coupled to the residue amplifier;
a feedforward equalizer coupled to receive the signal samples from the ADC, and to apply equalization to generate equalized samples;
a decoder coupled to an output of the feedforward equalizer, the decoder determining detected symbols from the equalized samples and a channel model by minimizing a cumulative metric that compensates the combined Gaussian and non-Gaussian noise in the received signal, the decoder to generate the decoded data; and
a channel estimator to receive the output of the feedforward equalizer and an output of the decoder and to generate the channel model and an error feedback signal to adaptively update coefficients of the feedforward equalizer based on the error feedback signal;
wherein the cumulative metric is approximated by $M \approx \Sigma_n[(\hat{y}_n)^v - (\hat{s}_n)^v]^2$ where M is the cumulative metric, $\hat{y}_n$ represents a sample at the output of the feedforward equalizer, $\hat{s}_n$ is a noise-free signal component of $\hat{y}_n$, where $0 < v \leq 1$.

19. The transceiver chip of claim 18, where v is given by $$v \approx 1 + 0.5 \frac{\log(M_{2,1}/M_{2,0})}{\log(S_0/S_1)},$$

where $M_{2,0}$ and $M_{2,1}$ are conditional second-order central moments of noise and where $S_0 = f(0,0,\ldots,0)$, $S_1 = f(1,1,\ldots,1)$.

20. The transceiver of claim 18 further comprising:
a transformation block to provide an approximate solution to $(\hat{y}_n)^v$, wherein the transformation block implements a function $LUT(\hat{y}_n) = (\hat{y}_n + y_{min})^v$ when the sample $\hat{y}_n$ is in an interval between $-y_{min}$ and $+y_{max}$, where $y_{min}$ and $y_{max}$ are the minimum and maximum values of the interval of the sample $\hat{y}_n$, respectively.

21. A transceiver chip for communication over an optical fiber, the transceiver chip comprising:
a host interface for providing encoded data in a host format for transmitting over the optical fiber and for receiving decoded data in the host format originating from the optical fiber;
transmit path circuitry to receive the encoded data from the host interface and generate an electrical signal suitable for driving a laser coupled to the optical fiber;
an input port for receiving a received signal originating from the optical fiber having combined non-Gaussian noise and Gaussian noise; and
receive path circuitry coupled between the input port and the host interface, the receive path circuitry comprising:
an analog-to-digital converter (ADC) that generates signal samples from the received signal having the combined non-Gaussian noise and Gaussian noise;
wherein the ADC is a pipelined ADC including an input track-and-hold stage followed by a plurality of low resolution ADC stages, each ADC stage including
a 1-bit comparator coupled to the input track-and-hold stage,
a 1-bit digital-to-analog converter (DAC) coupled to the 1-bit comparator,
an analog subtractor coupled to the 1-bit DAC and the input track-and-hold stage,
a residue amplifier coupled to the analog subtractor, and a track-and-hold circuit coupled to the residue amplifier;

a feedforward equalizer coupled to receive the signal samples from the ADC, and to apply equalization to generate equalized samples;

a decoder coupled to an output of the feedforward equalizer, the decoder determining detected symbols from the equalized samples and a channel model by minimizing a cumulative metric that compensates the combined Gaussian and non-Gaussian noise in the received signal, the decoder to generate the decoded data; and a channel estimator to receive the output of the feedforward equalizer and an output of the decoder and to generate the channel model and an error feedback signal to adaptively update coefficients of the feedforward equalizer based on the error feedback signal;

wherein the ADC further includes a look-up table (LUT) configured to the plurality of ADC stages to store the inverses of non-linear characteristics of the signal samples.

22. A transceiver chip for communication over an optical fiber, the transceiver chip comprising:

a host interface for providing encoded data in a host format for transmitting over the optical fiber and for receiving decoded data in the host format originating from the optical fiber;

transmit path circuitry to receive the encoded data from the host interface and generate an electrical signal suitable for driving a laser coupled to the optical fiber;

an input port for receiving a received signal originating from the optical fiber having combined non-Gaussian noise and Gaussian noise; and receive path circuitry coupled between the input port and the host interface, the receive path circuitry comprising:

an analog-to-digital converter (ADC) that generates signal samples from the received signal having the combined non-Gaussian noise and Gaussian noise;

wherein the ADC is a pipelined ADC including an input track-and-hold stage followed by a plurality of low resolution ADC stages, each ADC stage including
a 1-bit comparator coupled to the input track-and-hold stage,
a 1-bit digital-to-analog converter (DAC) coupled to the 1-bit comparator,
an analog subtractor coupled to the 1-bit DAC and the input track-and-hold stage,
a residue amplifier coupled to the analog subtractor, and
a track-and-hold circuit coupled to the residue amplifier;

a feedforward equalizer coupled to receive the signal samples from the ADC, and to apply equalization to generate equalized samples;

a decoder coupled to an output of the feedforward equalizer, the decoder determining detected symbols from the equalized samples and a channel model by minimizing a cumulative metric that compensates the combined Gaussian and non-Gaussian noise in the received signal, the decoder to generate the decoded data; and a channel estimator to receive the output of the feedforward equalizer and an output of the decoder and to generate the channel model and an error feedback signal to adaptively update coefficients of the feedforward equalizer based on the error feedback signal;

wherein the ADC further includes a lookahead pipeline configuration in which one or more of the plurality of ADC stages includes a pair of comparators configured to enable parallel interstage amplification and comparator operations.

* * * * *